(12) United States Patent
Takahashi

(10) Patent No.: US 11,322,703 B2
(45) Date of Patent: May 3, 2022

(54) PHOTOELECTRIC CONVERSION ELEMENT AND SOLID-STATE IMAGING APPARATUS

(71) Applicant: SONY SEMICONDUCTOR SOLUTIONS CORPORATION, Kanagawa (JP)

(72) Inventor: Shingo Takahashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 72 days.

(21) Appl. No.: 16/762,702

(22) PCT Filed: Oct. 30, 2018

(86) PCT No.: PCT/JP2018/040215
§ 371 (c)(1),
(2) Date: May 8, 2020

(87) PCT Pub. No.: WO2019/098003
PCT Pub. Date: May 23, 2019

(65) Prior Publication Data
US 2021/0175452 A1  Jun. 10, 2021

(30) Foreign Application Priority Data
Nov. 17, 2017 (JP) .............................. JP2017-221739

(51) Int. Cl.
*H01L 51/42* (2006.01)
*H01L 27/28* (2006.01)
(Continued)

(52) U.S. Cl.
CPC ........ *H01L 51/4253* (2013.01); *H01L 27/286* (2013.01); *H01L 27/307* (2013.01); *H01L 51/442* (2013.01); *H01L 27/14647* (2013.01)

(58) Field of Classification Search
CPC ......... H01L 27/30–308; H01L 51/0046–0047; H01L 51/42–448
See application file for complete search history.

(56) References Cited

U.S. PATENT DOCUMENTS

2011/0277822 A1  11/2011 Zheng et al.
2017/0062746 A1  3/2017 Sawaki

FOREIGN PATENT DOCUMENTS

CN  106463564 A  2/2017
JP  2004-103275 A  4/2004
(Continued)

OTHER PUBLICATIONS

International Search Report and Written Opinion of PCT Application No. PCT/JP2018/040215, dated Jan. 29, 2019, 08 pages of of ISRWO.

*Primary Examiner* — Daniel P Shook
(74) *Attorney, Agent, or Firm* — Chip Law Group

(57) ABSTRACT

A photoelectric conversion element according to an embodiment of the present disclosure includes: a first electrode; a second electrode opposed to the first electrode; and an organic photoelectric conversion layer provided between the first electrode and the second electrode and formed using a plurality of materials having average particle diameters different from each other, the plurality of materials including at least fullerene or a derivative thereof.

14 Claims, 15 Drawing Sheets

(51) Int. Cl.
*H01L 51/44* (2006.01)
*H01L 27/30* (2006.01)
*H01L 27/146* (2006.01)

(56) References Cited

FOREIGN PATENT DOCUMENTS

| | | | | |
|---|---|---|---|---|
| JP | 2008109112 A | * | 5/2008 | ........... Y02E 10/549 |
| JP | 2013-023752 A | | 2/2013 | |
| TW | 201618321 A | | 5/2016 | |
| WO | 2016/017350 A1 | | 2/2016 | |
| WO | 2016/194639 A1 | | 12/2016 | |
| WO | 2016/203925 A1 | | 12/2016 | |

\* cited by examiner

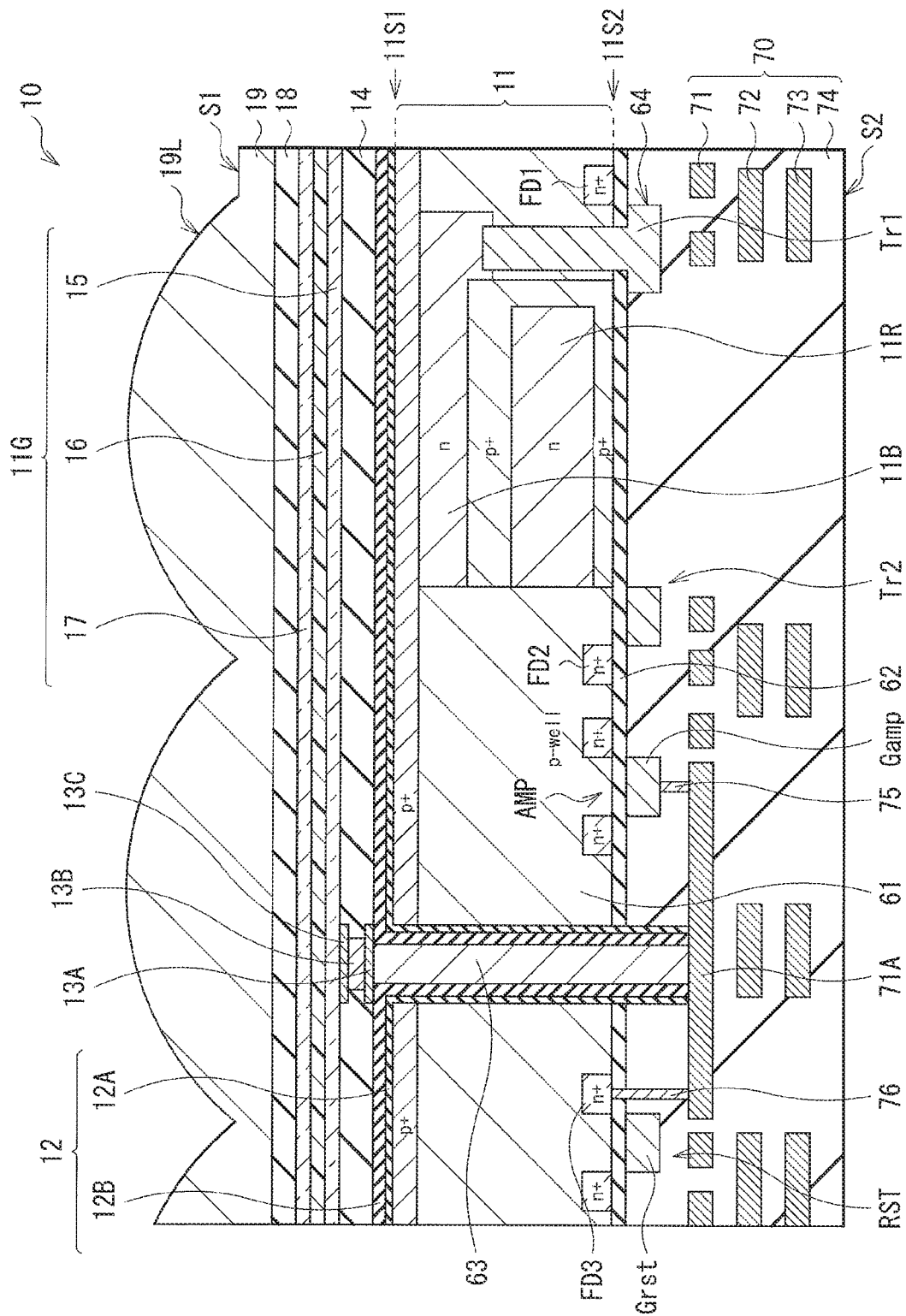
[FIG. 1]

[FIG. 2]
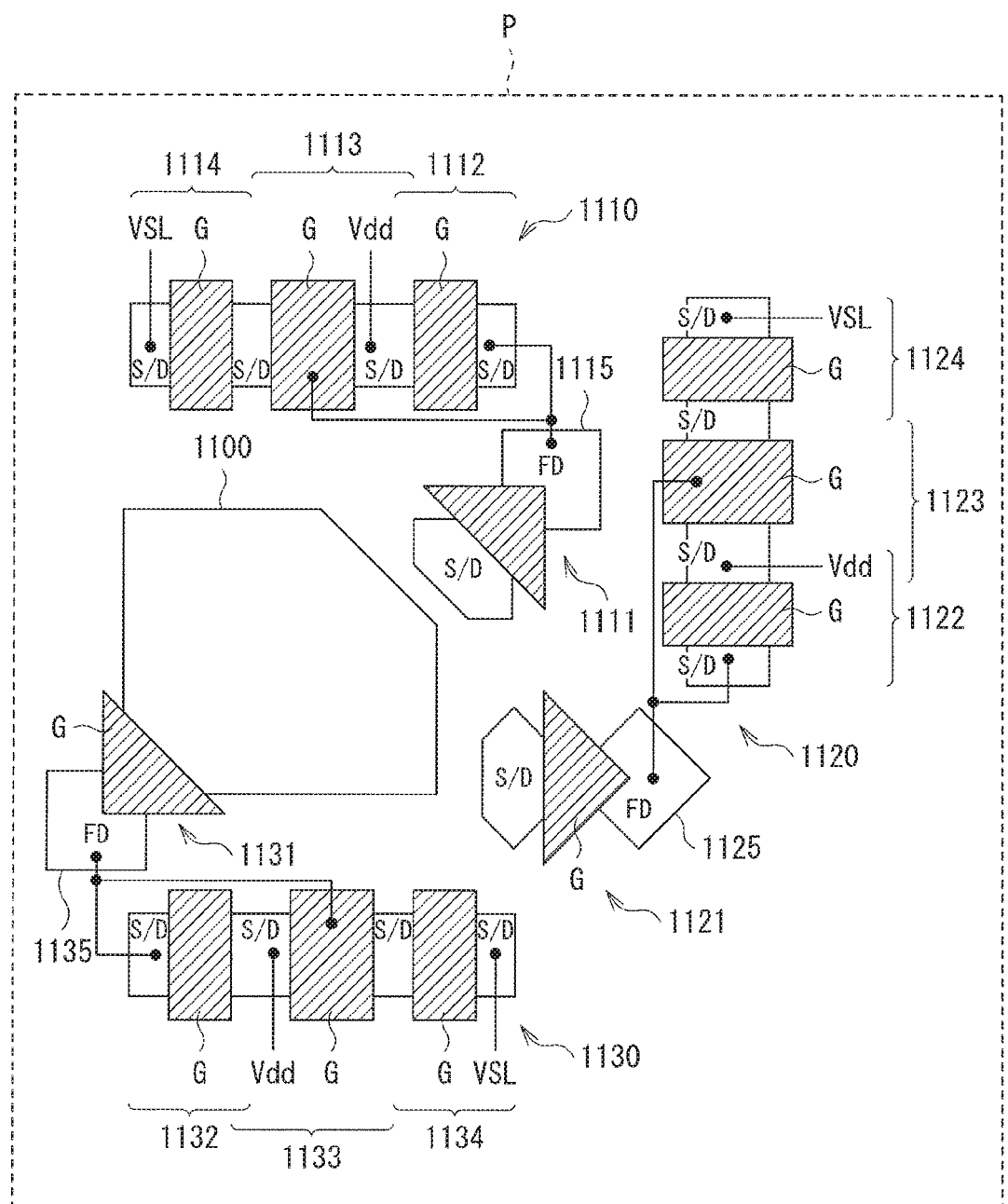

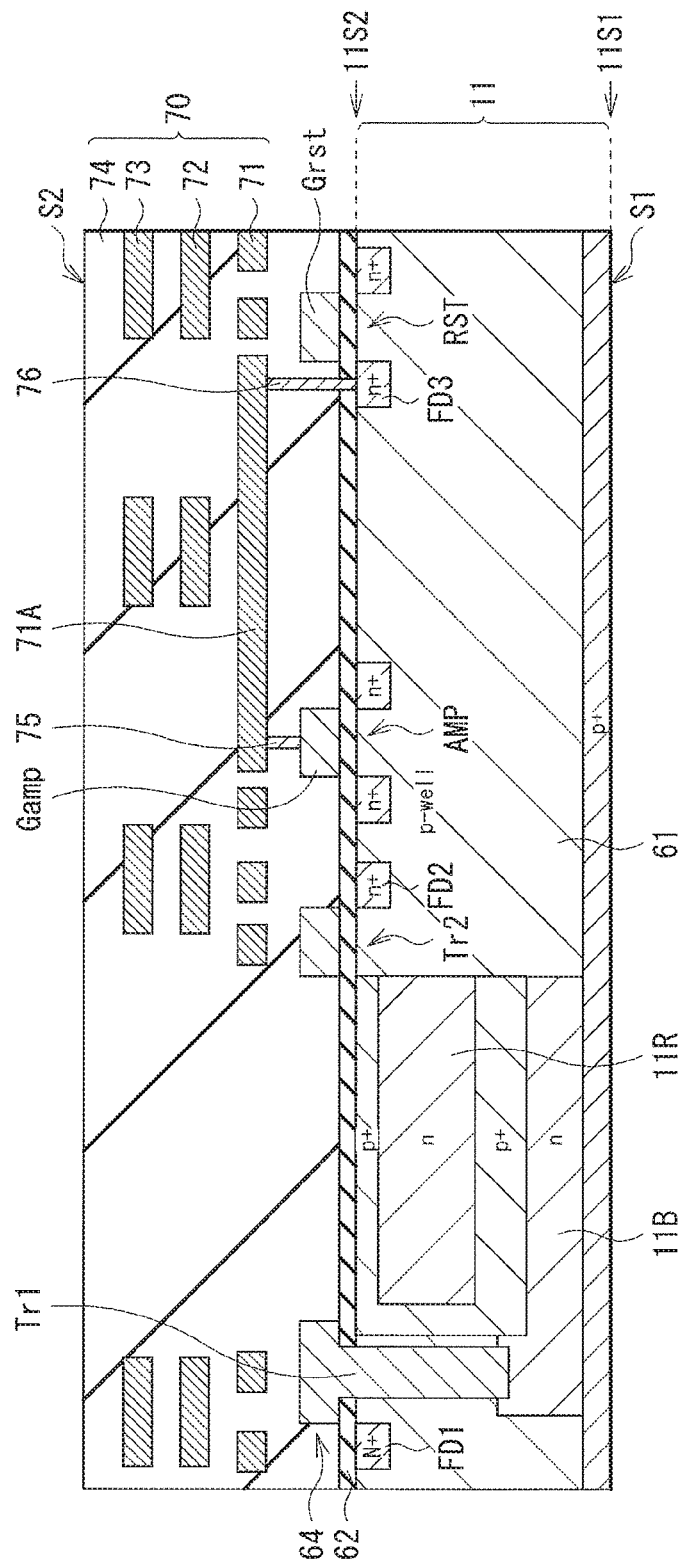
[FIG. 3]

[FIG. 4]
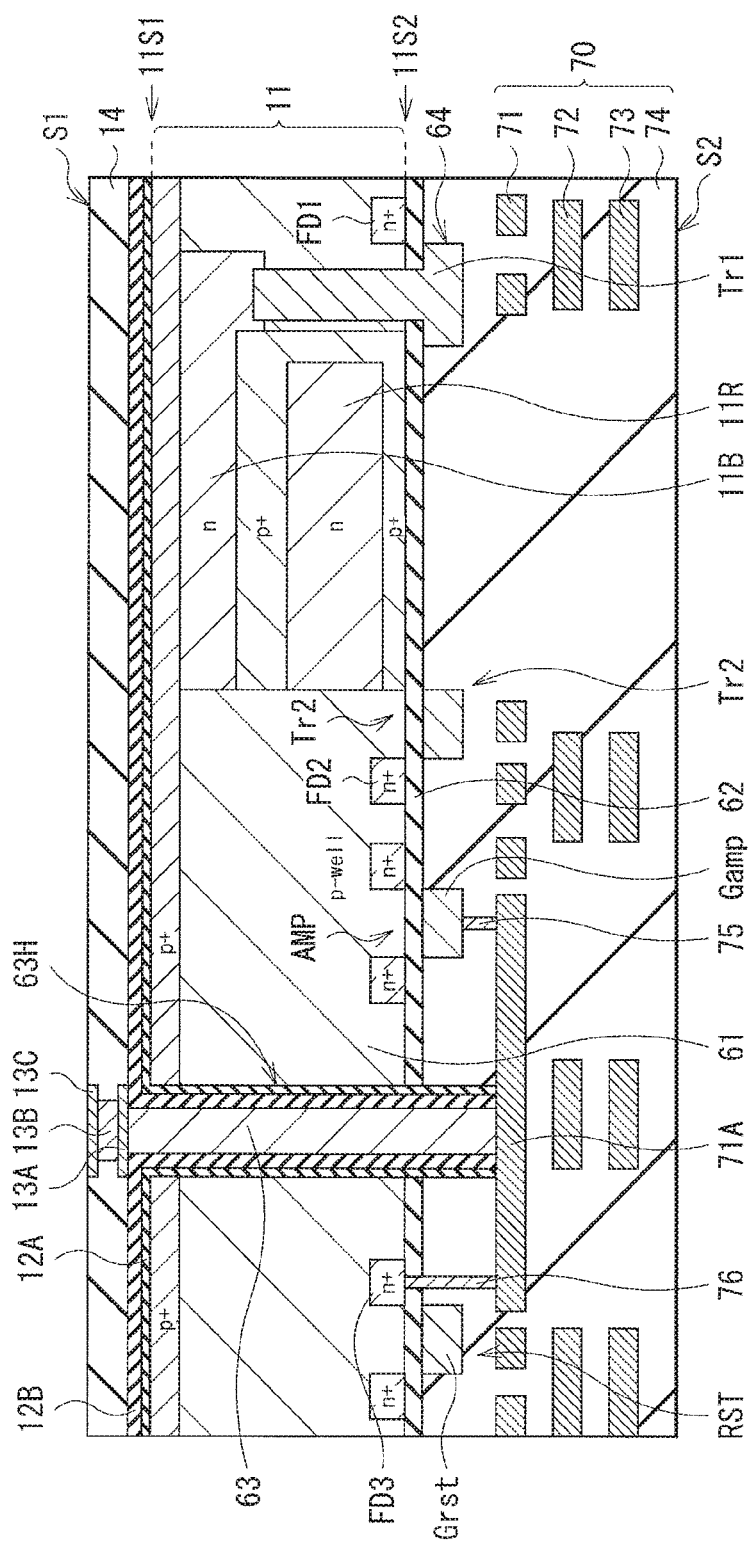

[ FIG. 5A ]
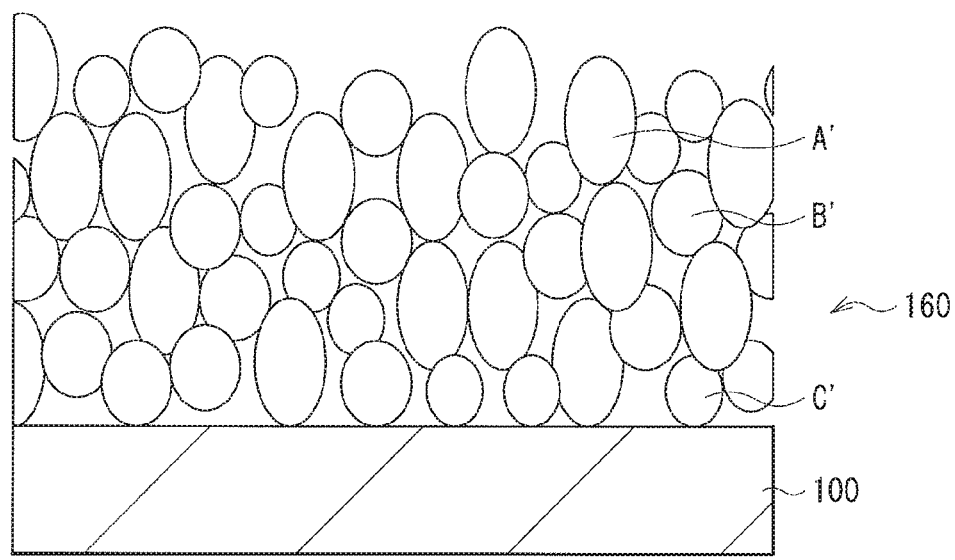
[ FIG. 5B ]
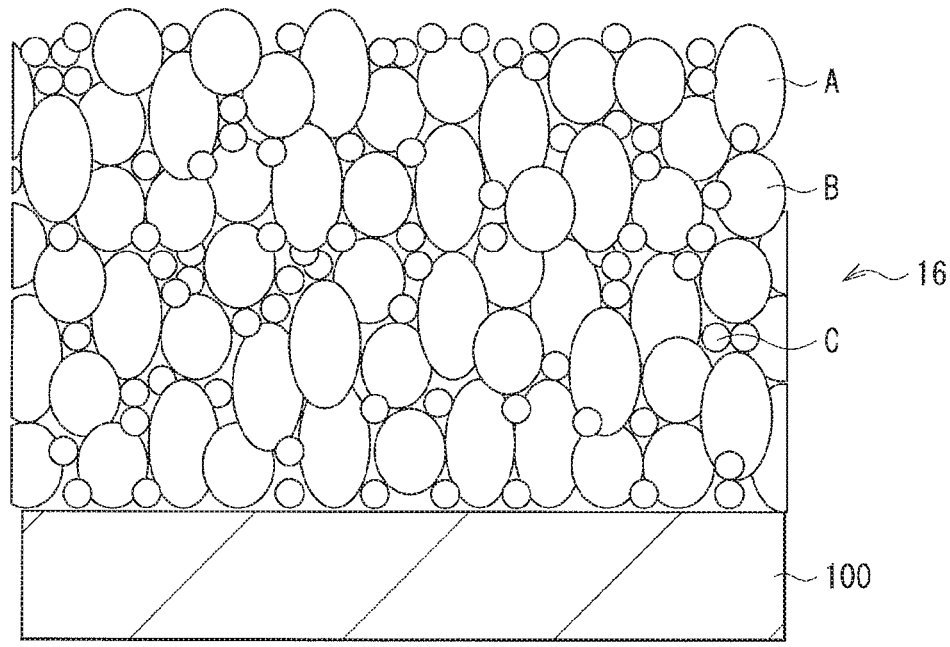

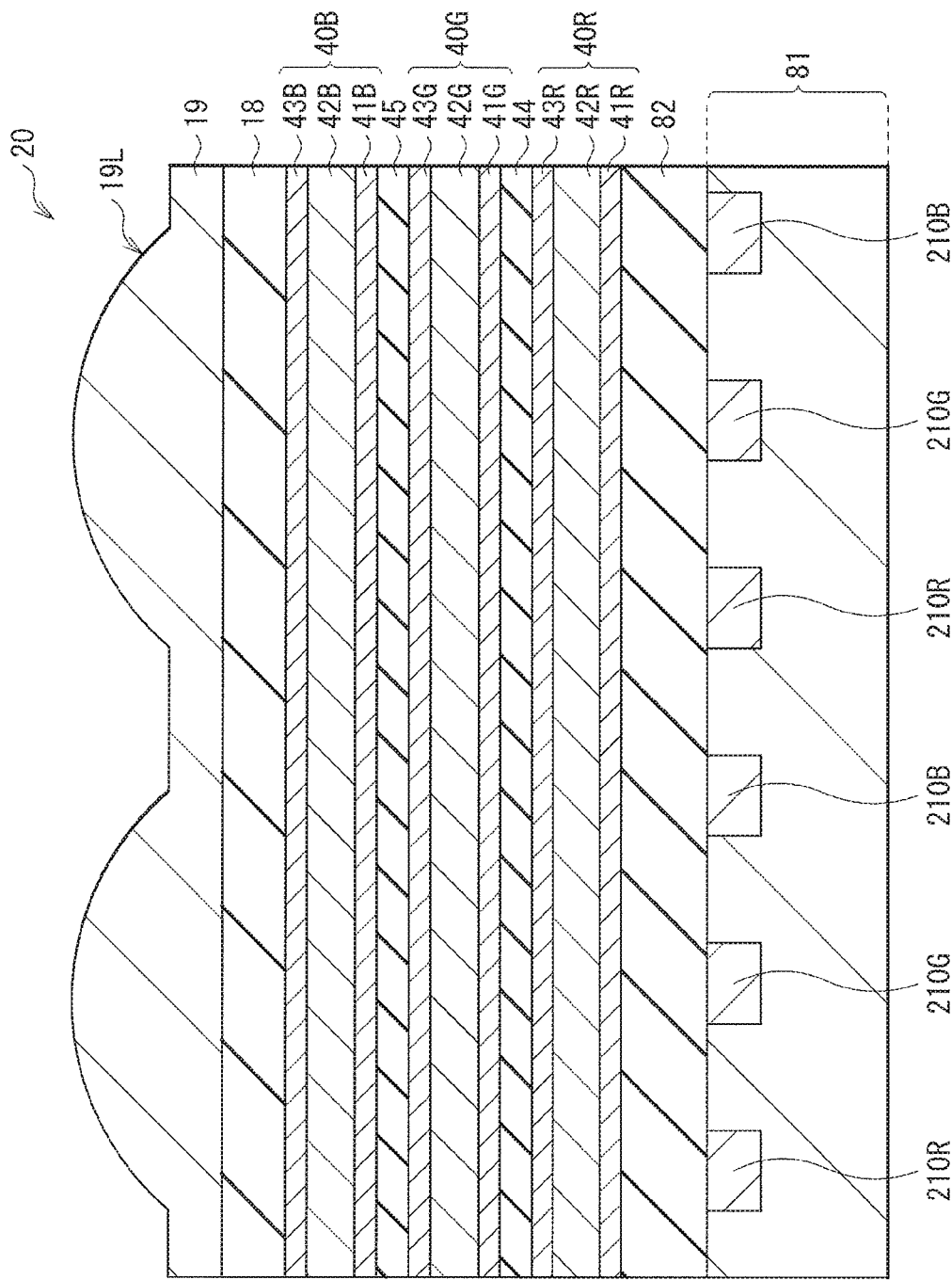
[FIG. 6]

[FIG. 7]
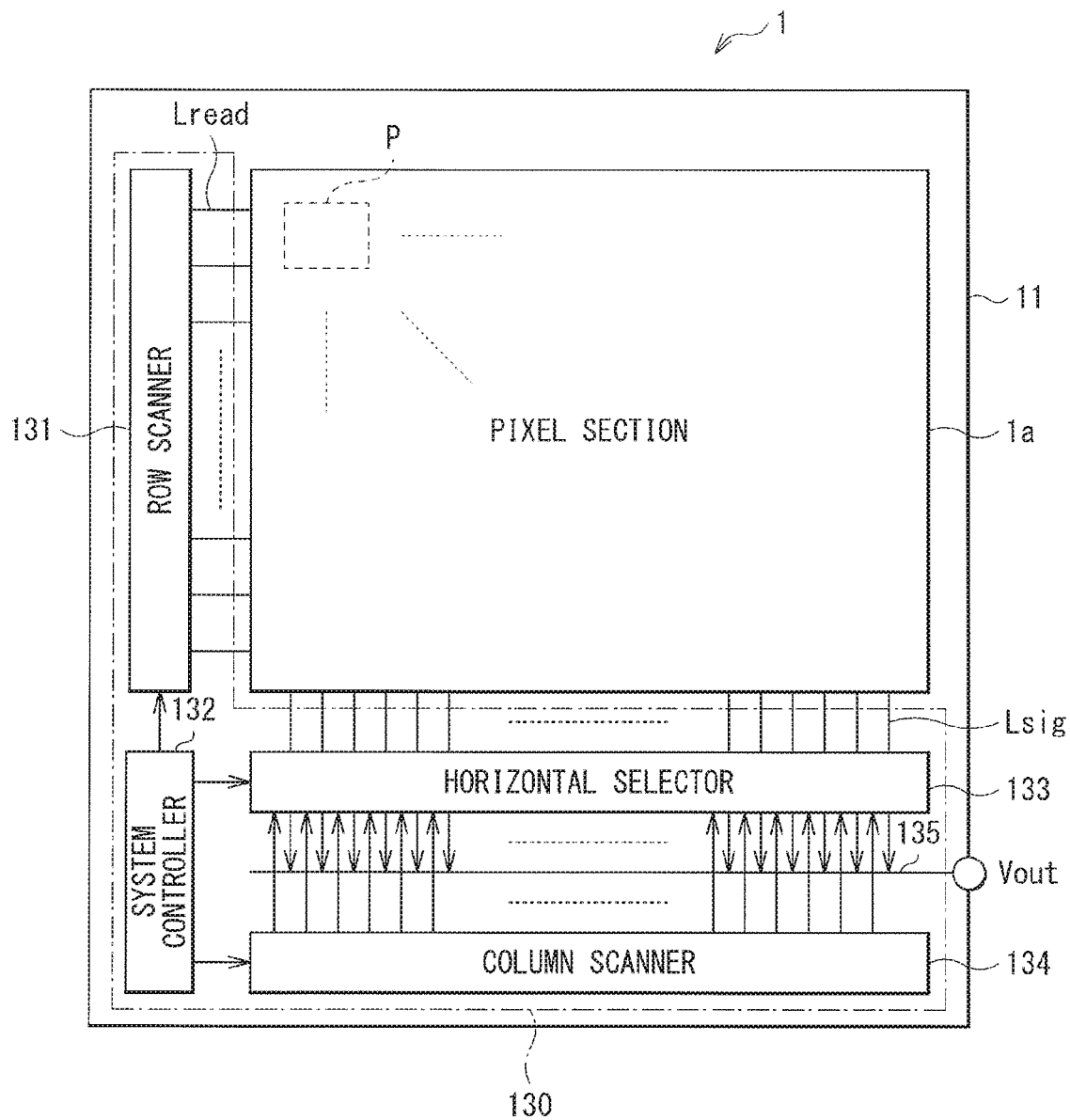

[FIG. 8]
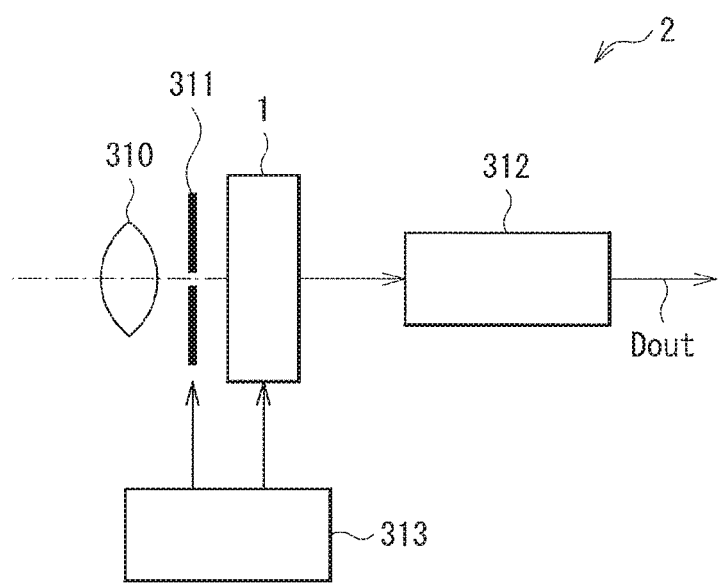

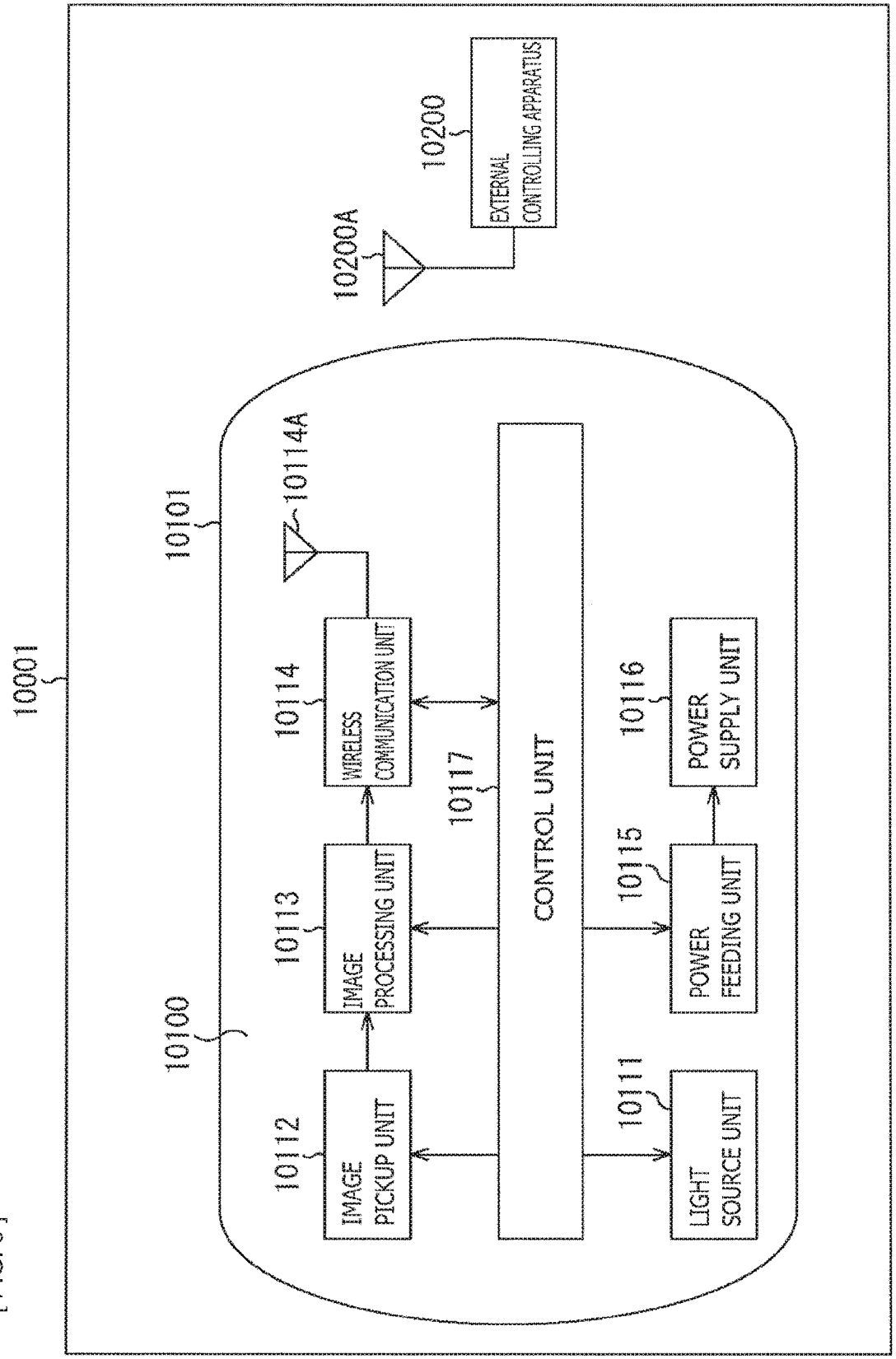
[FIG. 9]

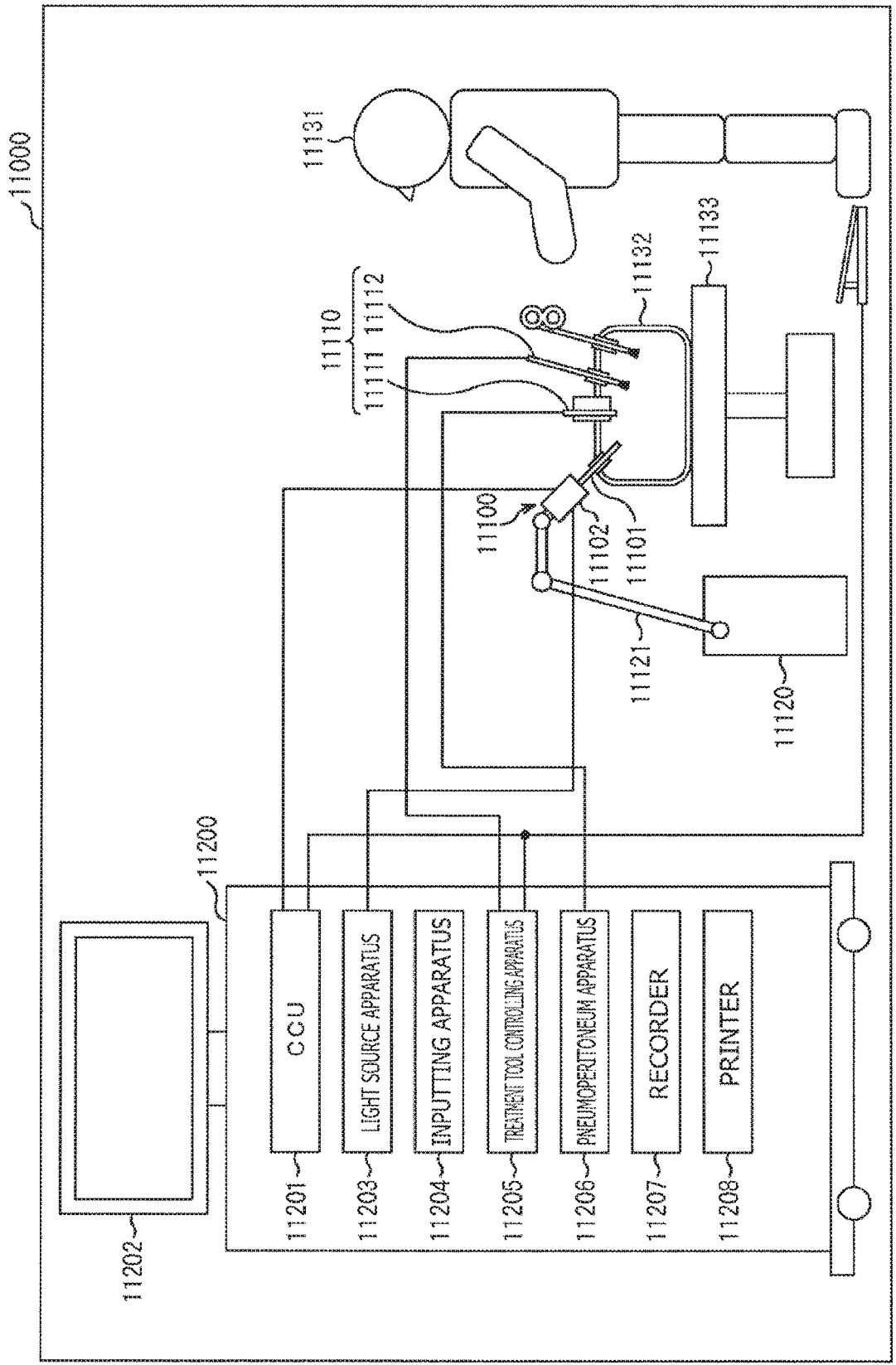

[FIG. 11]
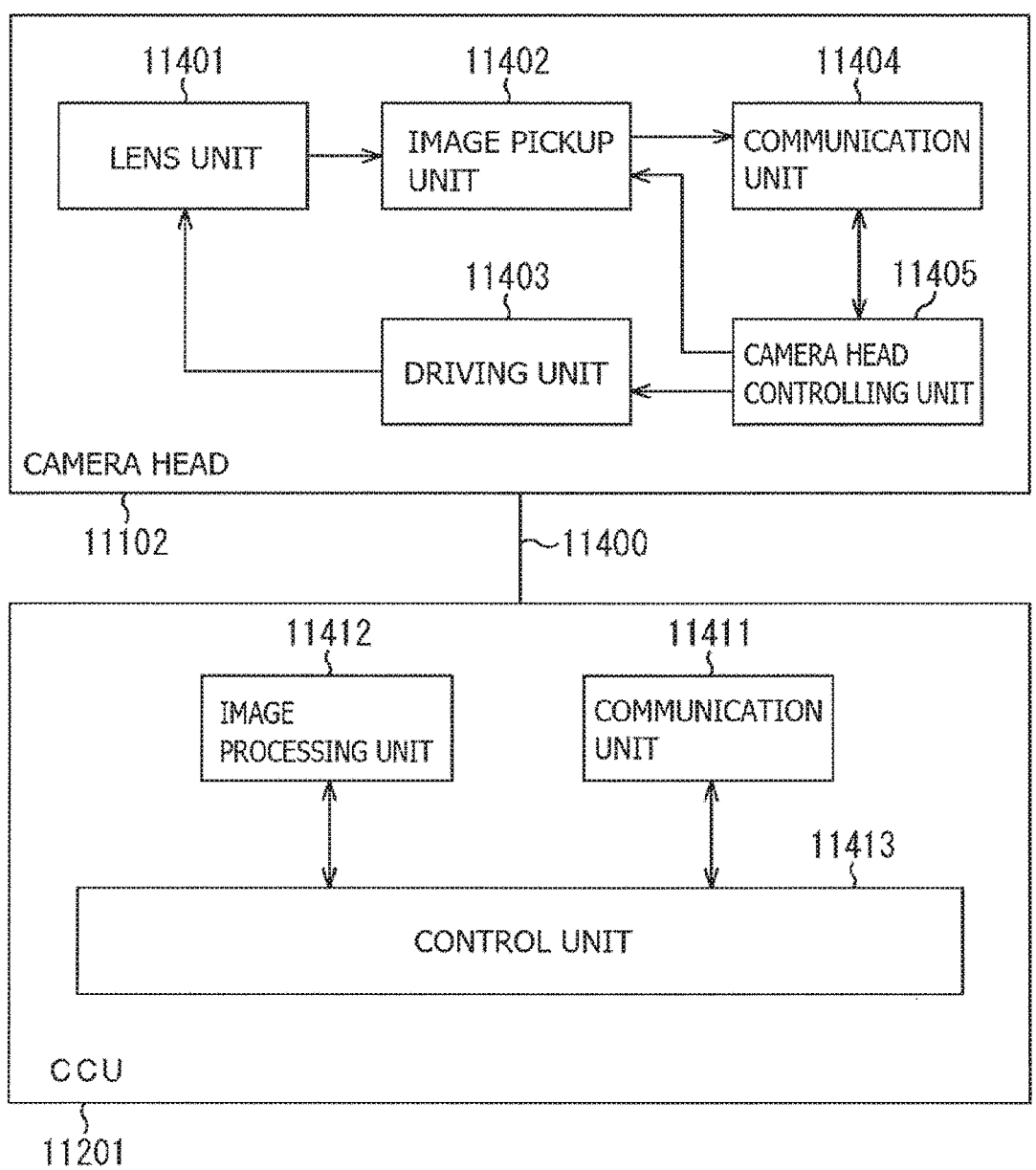

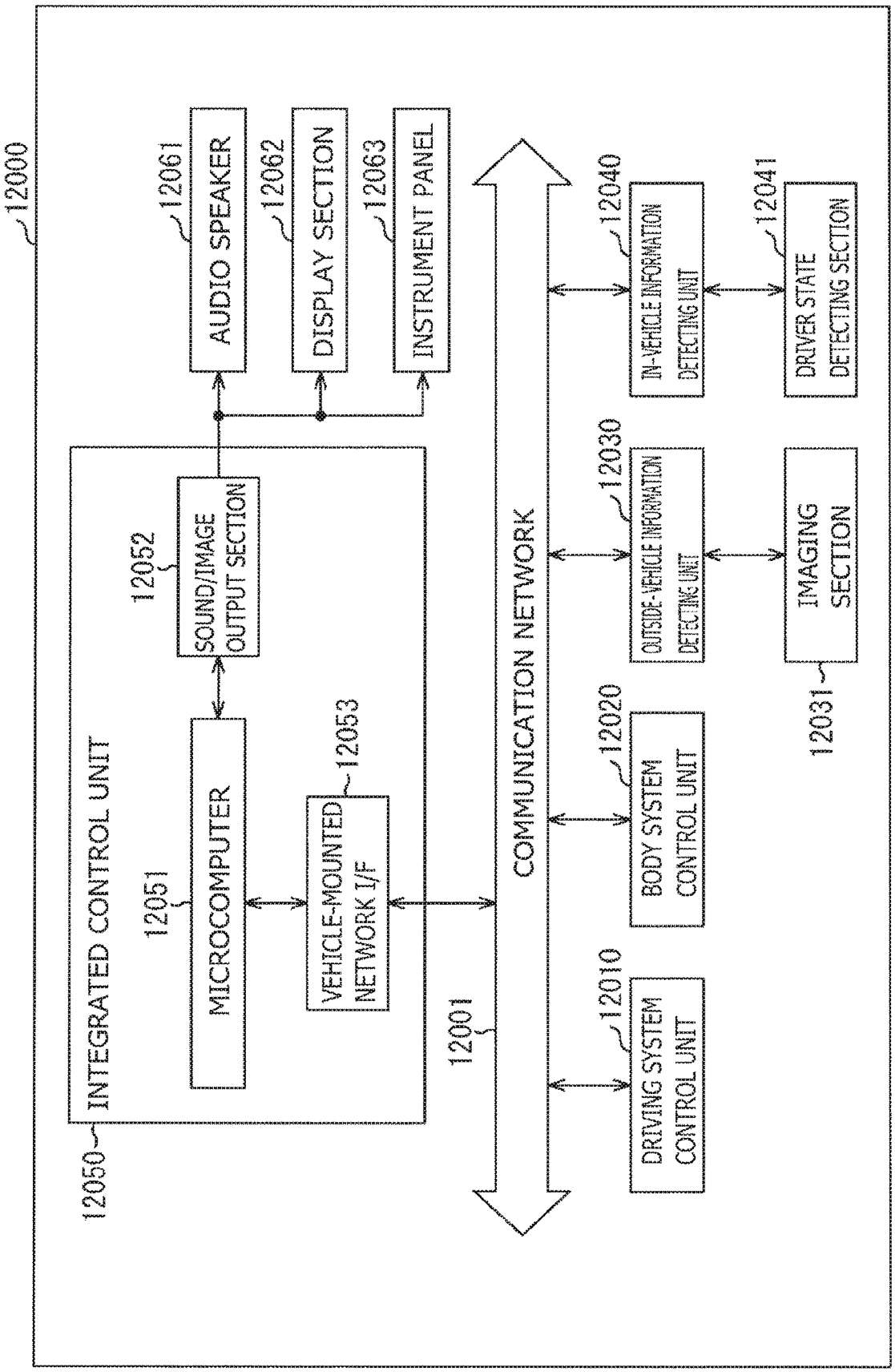

[FIG. 13]
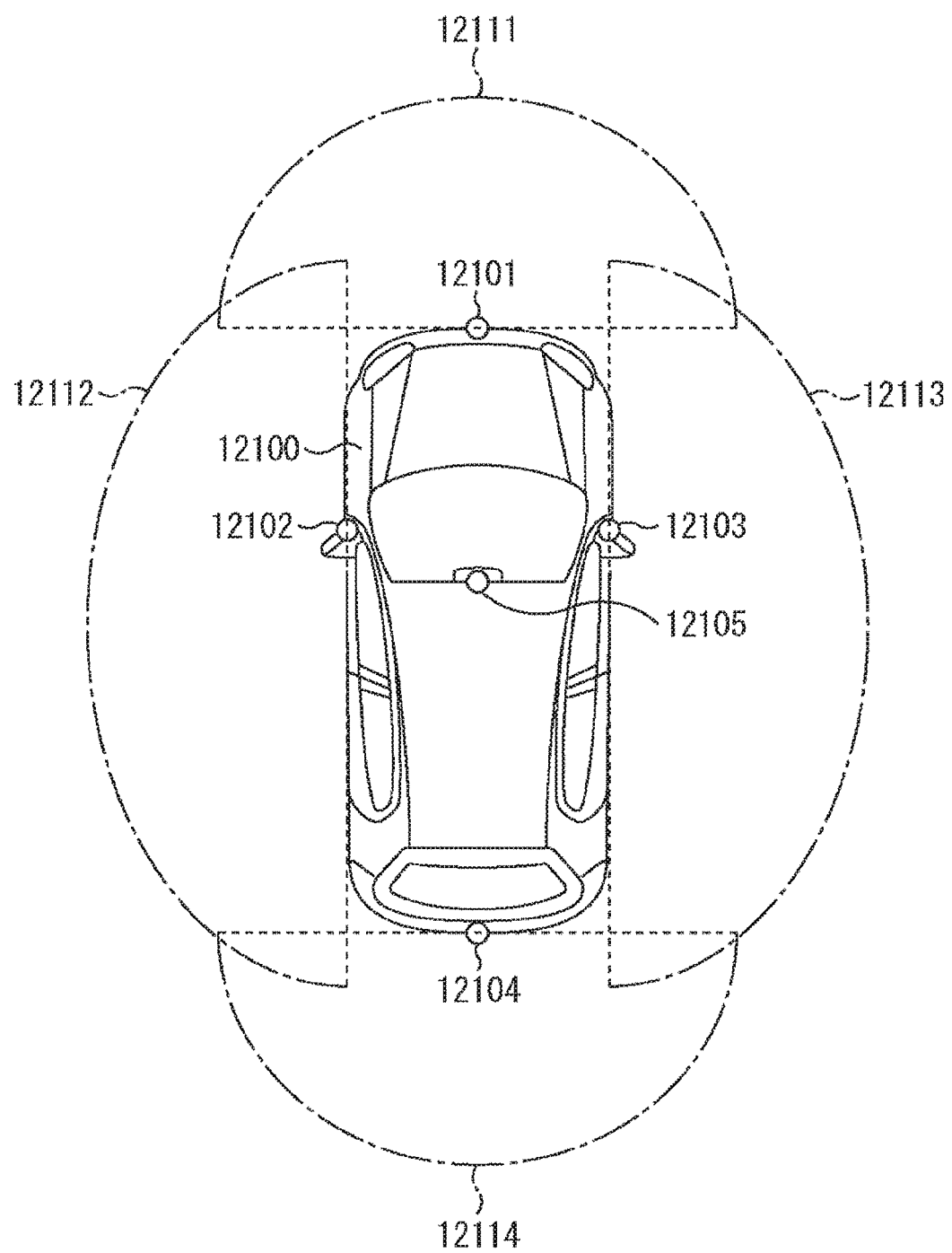

[ FIG. 14 ]
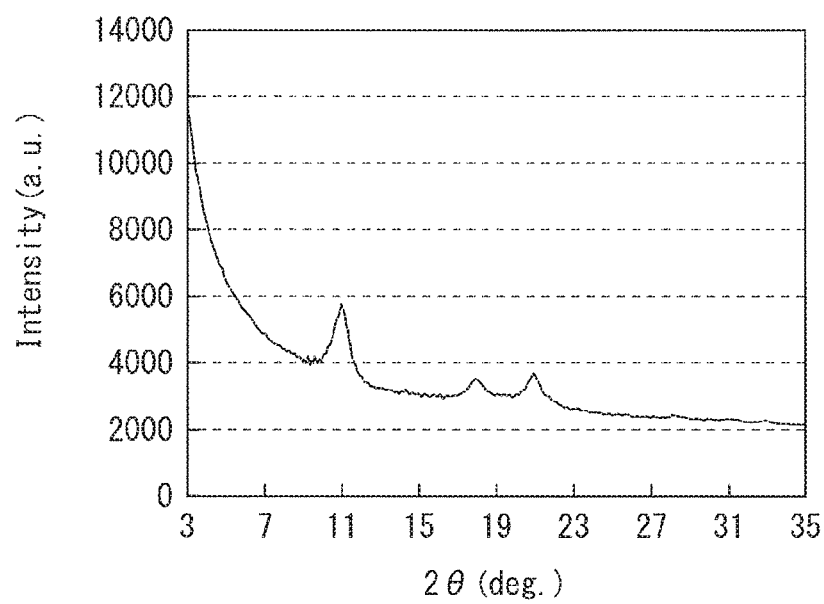
[ FIG. 15 ]
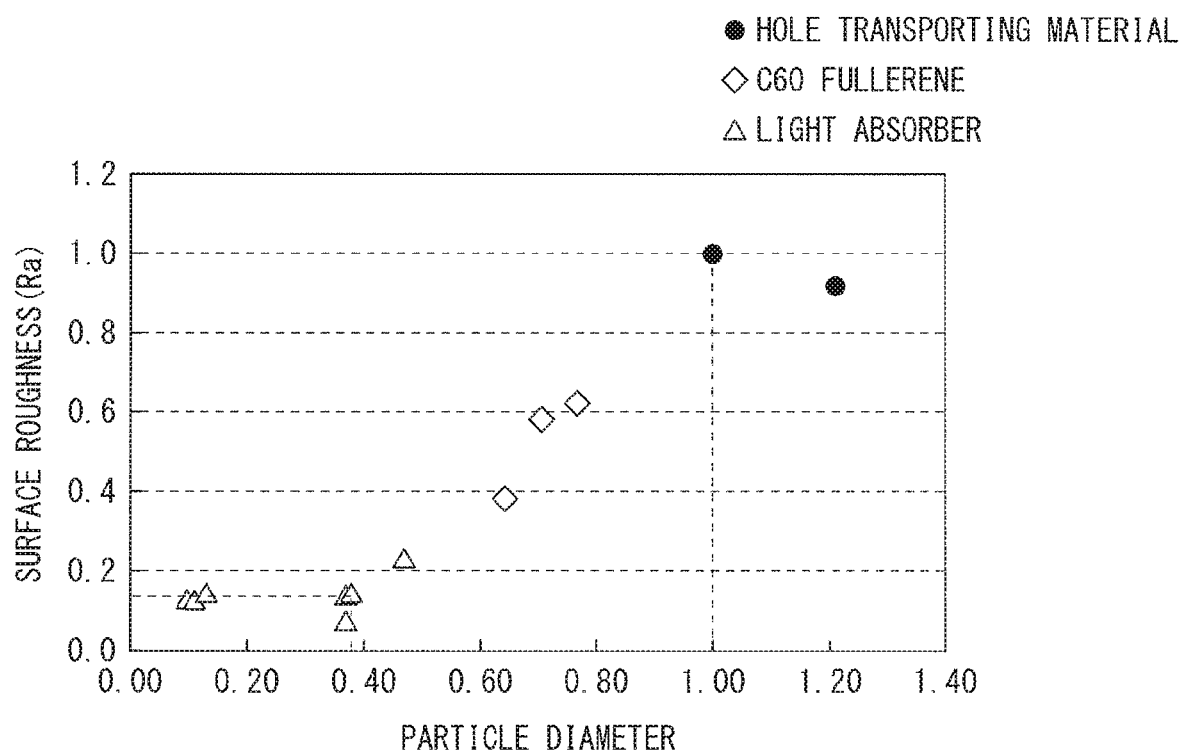

[FIG. 16]
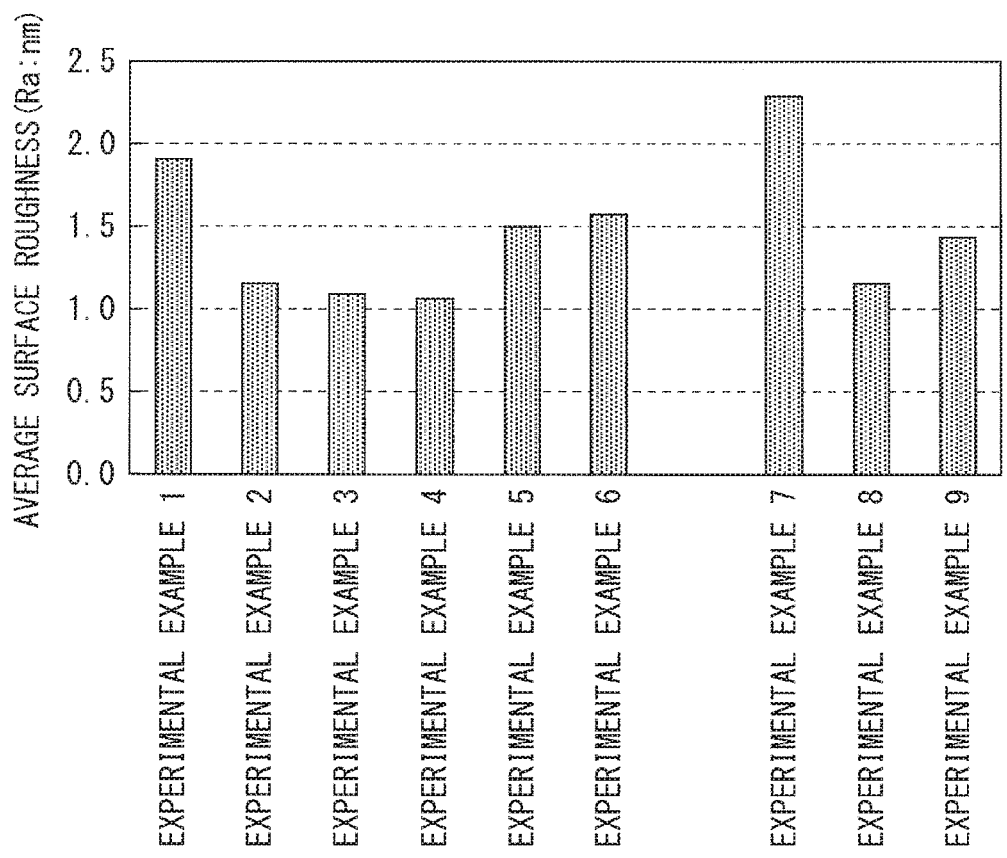

PHOTOELECTRIC CONVERSION ELEMENT AND SOLID-STATE IMAGING APPARATUS

CROSS REFERENCE TO RELATED APPLICATIONS

This application is a U.S. National Phase of International Patent Application No. PCT/JP2018/040215 filed on Oct. 30, 2018, which claims priority benefit of Japanese Patent Application No. JP 2017-221739 filed in the Japan Patent Office on Nov. 17, 2017. Each of the above-referenced applications is hereby incorporated herein by reference in its entirety.

TECHNICAL FIELD

The present disclosure relates to a photoelectric conversion element using an organic semiconductor material and a solid-state imaging apparatus including the same.

BACKGROUND ART

In recent years, devices using organic thin films have been developed. An organic photoelectric conversion element is one of the devices, and an organic thin-film solar cell, an organic imaging element, and the like each using the organic photoelectric conversion element have been proposed. The organic photoelectric conversion element adopts a bulk heterostructure in which a p-type organic semiconductor and an n-type organic semiconductor are mixed to achieve an improvement in electrical characteristics (for example, refer to PTLs 1 and 2). For example, in a photoelectric conversion element described in PTL 1, a plurality of particles included in a photoelectric conversion layer has an average particle diameter expressed as D50% of 50 µm to 300 µm, thereby achieving improvements in photoelectric conversion efficiency, an S/N ratio of a light current/a dark current, and response speed.

CITATION LIST

Patent Literature

PTL 1: Japanese Unexamined Patent Application Publication No. 2013-23752
PTL 2: International Publication No. WO 2016/194639

SUMMARY OF THE INVENTION

Incidentally, in an organic photoelectric conversion element including an organic photoelectric conversion layer in which a plurality of kinds of organic semiconductor materials is mixed, occurrence of a device failure resulting from a short circuit or the like between a pair of electrodes opposed to each other with the organic photoelectric conversion layer interposed therebetween has become an issue, and an improvement in reliability is desired.

It is desirable to provide a photoelectric conversion element and a solid-state imaging apparatus that make it possible to improve reliability.

A photoelectric conversion element according to an embodiment of the present disclosure includes: a first electrode; a second electrode opposed to the first electrode; and an organic photoelectric conversion layer provided between the first electrode and the second electrode and formed using a plurality of materials having average particle diameters different from each other, the plurality of materials including at least fullerene or a derivative thereof.

A solid-state imaging apparatus according to an embodiment of the present disclosure includes one or a plurality of organic photoelectric converters in each of pixels, and includes the photoelectric conversion element according to the above-described embodiment of the present disclosure as the organic photoelectric converters.

In the photoelectric conversion element according to the embodiment of the present disclosure and the solid-state imaging apparatus according to the embodiment of the present disclosure, as materials included in the organic photoelectric conversion layer including at least fullerene or a fullerene derivative, the materials having average particle diameters different from each other are used. This makes it possible to obtain a dense organic photoelectric conversion layer having less voids.

According to the photoelectric conversion element according to the embodiment of the present disclosure and the solid-state imaging apparatus according to the embodiment of the present disclosure, the materials having average particle diameters different from each other are used, thereby forming a dense organic photoelectric conversion layer having less voids. This makes it possible to improve reliability of the photoelectric conversion element and the solid-state imaging apparatus including the photoelectric conversion element.

It is to be noted that effects described here are not necessarily limited and any of effects described in the present disclosure may be included.

BRIEF DESCRIPTION OF DRAWINGS

FIG. 1 is a schematic cross-sectional view of a configuration of a photoelectric conversion element according to an embodiment of the present disclosure.
FIG. 2 is a schematic plan view of a configuration of a unit pixel of the photoelectric conversion element illustrated in FIG. 1.
FIG. 3 is a schematic cross-sectional view for describing a method of manufacturing the photoelectric conversion element illustrated in FIG. 1.
FIG. 4 is a schematic cross-sectional view of a process following FIG. 3.
FIG. 5A schematically illustrates a layer structure of a typical organic photoelectric conversion layer.
FIG. 5B schematically illustrates a layer structure of the organic photoelectric conversion layer illustrated in FIG. 1.
FIG. 6 is a schematic cross-sectional view of a configuration of a photoelectric conversion element according to a modification example of the present disclosure.
FIG. 7 is a block diagram illustrating an entire configuration of a solid-state imaging apparatus including the photoelectric conversion element illustrated in FIG. 1.
FIG. 8 is a functional block diagram illustrating an electronic apparatus (camera) using the solid-state imaging apparatus illustrated in FIG. 7.
FIG. 9 is a block diagram depicting an example of a schematic configuration of an in-vivo information acquisition system.
FIG. 10 is a view depicting an example of a schematic configuration of an endoscopic surgery system.
FIG. 11 is a block diagram depicting an example of a functional configuration of a camera head and a camera control unit (CCU).
FIG. 12 is a block diagram depicting an example of schematic configuration of a vehicle control system.

FIG. 13 is a diagram of assistance in explaining an example of installation positions of an outside-vehicle information detecting section and an imaging section.

FIG. 14 is an XRD profile of C60 fullerene.

FIG. 15 is a diagram illustrating a relationship between particle diameters and surface roughness (Ra) of materials included in an organic photoelectric conversion layer.

FIG. 16 is a characteristic diagram for comparison of average surface roughness at respective film formation temperatures of materials included in an organic photoelectric conversion layer.

MODES FOR CARRYING OUT THE INVENTION

In the following, some embodiments of the present disclosure are described in detail with reference to the drawings. The following description is given of specific examples of the present disclosure, and the present disclosure is not limited to the following embodiments. Moreover, the present disclosure is not limited to positions, dimensions, dimension ratios, and the like of respective components illustrated in the respective drawings. It is to be noted that description is given in the following order.
1. Embodiment (Photoelectric conversion element that includes an organic photoelectric conversion layer using a plurality of materials having average particle diameters different from each other)
1-1. Configuration of Photoelectric Conversion Element
1-2. Method of Manufacturing Photoelectric Conversion Element
1-3. Workings and Effects
2. Modification Example (Photoelectric conversion element in which a plurality of organic photoelectric converters are stacked)
3. Application Examples
4. Examples

1. Embodiment

FIG. 1 illustrates a cross-sectional configuration of a photoelectric conversion element (photoelectric conversion element 10) according to an embodiment of the present disclosure. The photoelectric conversion element 10 is included in one pixel (unit pixel P) of a solid-state imaging apparatus (solid-state imaging apparatus 1) such as a back-side illumination type (back-side light reception type) CCD (Charge Coupled Device) image sensor or a CMOS (Complementary Metal Oxide Semiconductor) image sensor (refer to FIG. 7). The photoelectric conversion element 10 is of a so-called longitudinal spectral type in which one organic photoelectric converter 11G and two inorganic photoelectric converters 11B and 11R are stacked in a longitudinal direction. In the present embodiment, an organic photoelectric conversion layer 16 included in the organic photoelectric converter 11G has a configuration formed using a plurality of materials having average particle diameters different from each other.

(1-1. Configuration of Photoelectric Conversion Element)

The photoelectric conversion element 10 includes, in each unit pixel P, one organic photoelectric converter 11G and two inorganic photoelectric converters 11B and 11R that are stacked in the longitudinal direction. The organic photoelectric converter 11G is provided on a back surface (first surface 11S1) of a semiconductor substrate 11. The inorganic photoelectric converters 11B and 11R are formed to be embedded in the semiconductor substrate 11, and are stacked in a thickness direction of the semiconductor substrate 11. The organic photoelectric converter 11G includes a p-type semiconductor and an n-type semiconductor, and includes an organic photoelectric conversion layer 16 having a bulk heterojunction structure in a layer. The bulk heterojunction structure is a p-n junction surface formed by mixing the p-type semiconductor and the n-type semiconductor.

The organic photoelectric converter 11G and the inorganic photoelectric converters 11B and 11R each selectively detect light in a corresponding one of wavelength bands different from each other, and perform photoelectric conversion of the thus-detected light. Specifically, the organic photoelectric converter 11G acquires a green (G) color signal. The inorganic photoelectric converters 11B and 11R respectively acquire a blue (B) color signal and a red (R) color signal by a difference in absorption coefficient. This allows the photoelectric conversion element 10 to acquire a plurality of color signals in one pixel without using a color filter.

It is to be noted that, in the present embodiment, description is given of a case where electrons of electron-hole pairs generated by photoelectric conversion are read as signal charges (in a case where an n-type semiconductor region serves as a photoelectric conversion layer). Moreover, in the drawings, "+(plus)" attached to "p" or "n" indicates that p-type or n-type impurity concentration is high, and "++" indicates that p-type or n-type impurity concentration is higher than that in a case of "+".

The semiconductor substrate 11 includes an n-type silicon (Si) substrate, for example, and has a p-well 61 in a predetermined region. For example, various kinds of floating diffusions (floating diffusion layers) FD (for example, FD1, FD2, and FD3), various kinds of transistors Tr (for example, a vertical transistor (transfer transistor) Tr1, a transfer transistor Tr2, an amplifier transistor (modulation element) AMP, and a reset transistor RST), and multilayer wiring 70 are provided on a second surface (front surface of the semiconductor substrate 11) 11S2 of the p-well 61. The multilayer wiring 70 has, for example, a configuration in which wiring layers 71, 72, and 73 are stacked in an insulating layer 74. Moreover, a peripheral circuit (not illustrated) including a logic circuit, and the like is provided in a periphery of the semiconductor substrate 11.

It is to be noted that in FIG. 1, the first surface 11S1 side of the semiconductor substrate 11 is represented as a light incident surface S1 and a second surface 11S2 side of the semiconductor substrate 11 is represented as a wiring layer side S2.

The inorganic photoelectric converters 11B and 11R each include, for example, a PIN (Positive Intrinsic Negative) photodiode, and each have a p-n junction in a predetermined region of the semiconductor substrate 11. The inorganic photoelectric converters 11B and 11R enable dispersion of light in the longitudinal direction with use of a difference in absorbed wavelength band depending on a depth of light incidence in the silicon substrate.

The inorganic photoelectric converter 11B selectively detects blue light to accumulate signal charges corresponding to blue, and is disposed at a depth that allows for efficient photoelectric conversion of blue light. The inorganic photoelectric converter 11R selectively detects red light to accumulate signal charges corresponding to red, and is disposed at a depth that allows for efficient photoelectric conversion of red light. It is to be noted that blue (B) and red (R) are colors respectively corresponding to a wavelength band from 450 nm to 495 nm, for example, and a wavelength band from 620 nm to 750 nm, for example. It is sufficient if each of the inorganic photoelectric converters 11B and 11R is allowed to detect light in a portion or the entirety of a corresponding one of the wavelength bands.

Specifically, as illustrated in FIG. 1, the inorganic photoelectric converter 11B and the inorganic photoelectric converter 11R each include, for example, a p+ region serving as a hole accumulation layer, and an n region serving as an electron accumulation layer (has a p-n-p stacking structure).

The n region of the inorganic photoelectric converter 11B is coupled to the vertical transistor Tr1. The p+ region of the inorganic photoelectric converter 11B bends along the vertical transistor Tr1 and is coupled to the p+ region of the inorganic photoelectric converter 11R.

For example, the floating diffusions (floating diffusion layers) FD1, FD2, and FD3, the vertical transistor (transfer transistor) Tr1, the transfer transistor Tr2, the amplifier transistor (modulation element) AMP, and the reset transistor RST are provided on the second surface 11S2 of the semiconductor substrate 11, as described above.

The vertical transistor Tr1 is a transfer transistor that transfers, to the floating diffusion FD1, signal charges (herein, electrons) corresponding to blue generated and accumulated in the inorganic photoelectric converter 11B. The inorganic photoelectric converter 11B is formed at a position deep from the second surface 11S2 of the semiconductor substrate 11; therefore, the transfer transistor of the inorganic photoelectric converter 11B preferably includes the vertical transistor Tr1.

The transfer transistor Tr2 transfers, to the floating diffusion FD2, signal charges (herein, electrons) corresponding to red generated and accumulated in the inorganic photoelectric converter 11R, and includes, for example, a MOS transistor.

The amplifier transistor AMP is a modulation element that modulates an amount of charges generated in the organic photoelectric converter 11G into a voltage, and includes, for example, a MOS transistor.

The reset transistor RST resets charges transferred from the organic photoelectric converter 11G to the floating diffusion FD3, and includes, for example, a MOS transistor.

A first lower contact 75, a second lower contact 76, and an upper contact 13B each include, for example, a doped silicon material such as PDAS (Phosphorus Doped Amorphous Silicon) or a metal material such as aluminum (Al), tungsten (W), titanium (Ti), cobalt (Co), hafnium (Hf), and tantalum (Ta).

The organic photoelectric converter 11G is provided on the first surface 11S1 side of the semiconductor substrate 11. The organic photoelectric converter 11G has, for example, a configuration in which a lower electrode 15, the organic photoelectric conversion layer 16, and an upper electrode 17 are stacked in this order from the first surface 11S1 side of the semiconductor substrate 11. The lower electrode 15 is formed separately for each photoelectric conversion element 10, for example. The organic photoelectric conversion layer 16 and the upper electrode 17 are provided as a continuous layer common to a plurality of photoelectric conversion elements 10. The organic photoelectric converter 11G is an organic photoelectric conversion element that absorbs green light corresponding to a wavelength band of a portion or the entirety of a selective wavelength band (for example, from 450 nm to 650 nm both inclusive) to generate electron-hole pairs.

For example, interlayer insulating layers 12 and 14 are stacked, between the first surface 11S1 of the semiconductor substrate 11 and the lower electrode 15, in this order from the semiconductor substrate 11 side. The interlayer insulating layer has, for example, a configuration in which a layer having fixed charges (fixed charge layer) 12A and a dielectric layer 12B having an insulation property are stacked. A protective layer 18 is provided on the upper electrode 17. An on-chip lens layer 19 is provided above the protective layer 18. The on-chip lens layer 19 includes on-chip lenses 19L and also serves as a planarization layer.

A through electrode 63 is provided between the first surface 11S1 and the second surface 11S2 of the semiconductor substrate 11. The organic photoelectric converter 11G is coupled to a gate Gamp of the amplifier transistor AMP and the floating diffusion FD3 via the through electrode 63. This allows the photoelectric conversion element 10 to well transfer charges generated in the organic photoelectric converter 11G on the first surface 11S1 side of the semiconductor substrate 11 to the second surface 11S2 side of the semiconductor substrate 11 via the through electrode 63, thereby improving characteristics.

The through electrode 63 is provided for each organic photoelectric converter 11G in each of the photoelectric conversion elements 10, for example. The through electrode 63 has a function as a connector between the organic photoelectric converter 11G and both the gate Gamp of the amplifier transistor AMP and the floating diffusion FD3, and serves as a transmission path of charges (herein, electrons) generated in the organic photoelectric converter 11G.

A lower end of the through electrode 63 is coupled to a coupling section 71A in the wiring layer 71, and the coupling section 71A and the gate Gamp of the amplifier transistor AMP are coupled to each other through a first lower contact 75. The coupling section 71A and the floating diffusion FD3 are coupled to each other through a second lower contact 76. It is to be noted that FIG. 1 illustrates the through electrode 63 having a cylindrical shape, but the through electrode 63 is not limited thereto, and may have a tapered shape, for example.

A reset gate Grst of the reset transistor RST is preferably disposed adjacent to the floating diffusion FD3 as illustrated in FIG. 1. This makes it possible to reset charges accumulated in the floating diffusion FD by the reset transistor RST.

In the photoelectric conversion element 10 according to the present embodiment, light having entered the organic photoelectric converter 11G from the upper electrode 17 side is absorbed by the organic photoelectric conversion layer 16. Excitons thereby generated move to an interface between an electron donor and an electron acceptor included in the photoelectric conversion layer 16, and the excitons are dissociated, that is, the excitons are dissociated into electrons and holes. Charges generated herein (electrons and holes) are each carried to different electrodes by diffusion resulting from a difference in concentration between carriers or an internal electric field resulting from a difference in work function between an anode (herein, the upper electrode 17) and a cathode (herein, the lower electrode 15), and detected as a photocurrent. Moreover, it is also possible to control transport directions of the electrons and the holes by application of a potential between the lower electrode 15 and the upper electrode 17.

In the following, description is given of the configurations, materials, and the like of respective components.

The organic photoelectric converter 11G is an organic photoelectric conversion element that absorbs green light corresponding to a wavelength band of a portion or the entirety of a selective wavelength band (for example, from 450 nm to 650 nm both inclusive) to generate electron-hole pairs.

The lower electrode 15 is directly opposed to light reception surfaces of the inorganic photoelectric converters 11B and 11R formed in the semiconductor substrate 11, and is provided in a region covering these light reception surfaces. The lower electrode 15 includes an electrically conductive film having light transmissivity, and includes, for example, ITO (indium-tin oxide). Note that, in addition to ITO, a tin oxide ($SnO_2$)-based material to which a dopant is added or a zinc oxide-based material prepared by adding a dopant to aluminum zinc oxide (ZnO) may be used as constituent materials of the lower electrode 15. Examples of the zinc oxide-based material include aluminum zinc oxide (AZO) to which aluminum (Al) is added as a dopant, gallium zinc oxide (GZO) to which gallium (Ga) is added, and indium zinc oxide (IZO) to which indium (In) is added. Moreover, in addition to these materials, CuI, InSbO$_4$, ZnMgO, CuInO$_2$, MgIN$_2$O$_4$, CdO, ZnSnO$_3$, or the like may be used.

The photoelectric conversion layer 16 converts optical energy into electric energy, and provides a field in which excitons generated by light absorption are dissociated into electrons and holes. The photoelectric conversion layer 16 includes, for example, two or more kinds of organic semiconductor materials, and preferably includes one or both of a p-type semiconductor and an n-type semiconductor, for example. One of the p-type semiconductor and the n-type semiconductor is preferably a material having transmissivity to visible light, and the other is preferably a material that performs photoelectric conversion of light in a selective wavelength region (for example, from 450 nm to 650 nm both inclusive). Alternatively, the organic photoelectric conversion layer 16 preferably includes three kinds of organic semiconductor materials, that is, a material (light absorber) that performs photoelectric conversion of light in a selective wavelength region and an n-type semiconductor and a p-type semiconductor that have transmissivity to visible light. The organic photoelectric conversion layer 16 in the present embodiment is formed using, for example, three kinds of organic semiconductor materials having average particle diameters different from each other, and has, in a layer, a bulk heterostructure in which these three kinds of organic semiconductors are randomly mixed.

First, the three kinds of organic semiconductor materials included in the organic photoelectric conversion layer 16 include C60 fullerene represented by the following general expression (1) or a derivative thereof, or C70 fullerene represented by the following general expression (2) or a derivative thereof. Using at least one kind of fullerene 60, fullerene 70, and a derivative thereof makes it possible to further improve photoelectric conversion efficiency and reduce a dark current.

(R1 and R2 are each a hydrogen atom, a halogen atom, a straight-chain, branched, or cyclic alkyl group, a phenyl group, a group having a straight-chain or condensed ring aromatic compound, a group having a halogen compound, a partial fluoroalkyl group, a perfluoroalkyl group, a silyl alkyl group, a silyl alkoxy group, an aryl silyl group, an aryl sulfanyl group, an alkyl sulfanyl group, an aryl sulfonyl group, an alkyl sulfonyl group, an aryl sulfide group, an alkyl sulfide group, an amino group, an alkyl amino group, an aryl amino group, a hydroxy group, an alkoxy group, an acyl amino group, an acyloxy group, a carbonyl group, a carboxy group, a carboxamide group, a carboalkoxy group, an acyl group, a sulfonyl group, a cyano group, a nitro group, a group having a chalcogen compound, a phosphine group, a phosphone group, or any of derivatives thereof. Each of n and m is 0 or an integer of 1 or greater.)

It is preferable to further use an organic semiconductor material having crystallinity as the material of the organic photoelectric conversion layer 16. The organic semiconductor material having crystallinity is preferably a material having hole transportability (hole transportable material), for example. Specific examples of the material include quinacridone and a derivative thereof, triallylamine and a derivative thereof, and benzothienobenzothiophene and a derivative thereof.

It is preferable to further use a material (light absorber) having an absorption maximum wavelength as the material of the organic photoelectric conversion layer 16. For example, an organic semiconductor material having an absorption maximum wavelength at a wavelength longer than blue light (a wavelength of 450 nm) is preferably used, and more specifically, for example, an organic semiconductor material having an absorption maximum wavelength in a wavelength region from 500 nm to 600 nm both inclusive is preferably used. This makes it possible to selectively perform photoelectric conversion of green light in the organic photoelectric converter 11G. Examples of such materials include subphthalocyanine represented by the following general expression (3) and a derivative thereof.

[Chem. 2]

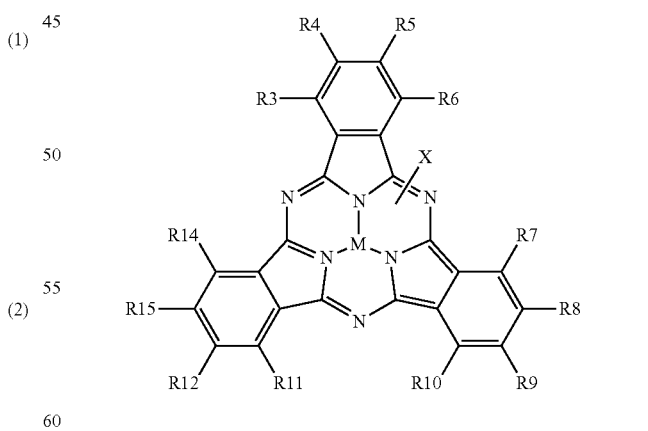

(3)

[Chem. 1]

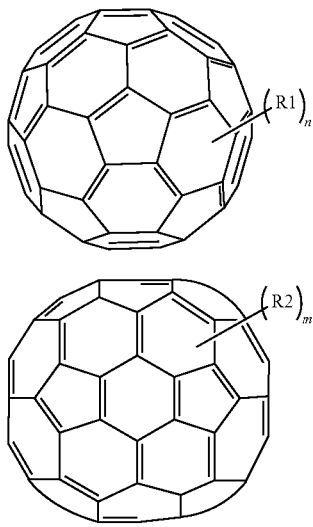

(1)

(2)

(R3 to R14 are each independently selected from a group configured of a hydrogen atom, a halogen atom, a straight-chain, branched, or cyclic alkyl group, a thioalkyl group, a thioaryl group, an aryl sulfonyl group, an alkyl sulfonyl group, an amino group, an alkyl amino group, an aryl amino group, a hydroxy group, an alkoxy group V, an acyl amino group, an acyloxy group, a phenyl group, a carboxy group, a carboxamide group, a carboalkoxy group, an acyl group, a sulfonyl group, a cyano group, and a nitro group, and any adjacent ones of R3 to R14 are optionally part of a condensed aliphatic ring or a condensed aromatic ring. The condensed aliphatic ring or the condensed aromatic ring described above optionally includes one or a plurality of atoms other than carbon. M is boron or a divalent or trivalent metal. X is a substituent group of one selected from a group configured of a halogen, a hydroxy group, a thiol group, an imide group, a substituted or unsubstituted alkoxy group, a substituted or unsubstituted aryloxy group, a substituted or unsubstituted alkyl group, a substituted or unsubstituted alkylthio group, and a substituted or unsubstituted arylthio group.)

The organic photoelectric conversion layer 16 is preferably formed using, for example, one kind of above-described fullerenes including fullerene 60 and fullerene 70 and derivatives thereof, one kind of the organic semiconductor material having crystallinity, and one kind of subphthalocyanine and a derivative thereof. A combination of the above-described fullerenes or derivatives thereof, and the organic semiconductor material having crystallinity functions as a p-type semiconductor or an n-type semiconductor depending on materials to be combined together. Here, fullerenes or derivatives thereof function as n-type semiconductors, and the organic semiconductor material having crystallinity functions as a p-type semiconductor.

In the present embodiment, as described above, three kinds of materials (a material A, a material B, and a material C) included in the organic photoelectric conversion layer 16 preferably have average particle diameters different from each other. Specifically, a particle diameter ratio of a material (the material C) having the smallest average particle diameter to a material (the material A) having the largest average particle diameter is preferably 0.6 or less. In addition, average surface roughness (Ra) of the organic photoelectric conversion layer 16 formed using the material A, the material B, and the material C having average particle diameters different from each other is preferably 2 nm or less. Here, the particle diameter is a diameter of a crystal particle in which molecules having the same orientation are stacked, and the diameter of the crystal particle is determined with use of an X-ray analysis (XRD) method. Specifically, the largest peak in an XRD profile obtained by XRD measurement is selected, and a half width ($B_{exp}$) by peak separation is obtained. The obtained half width ($B_{exp}$) is subjected to instrument coefficient correction (X-ray spread correction) ($B_I$) with use of the following mathematical expression (1), and thereafter, a particle diameter (D) of the crystal particle is obtained with use of the Scherrer's equation represented by the following mathematical expression (2).

[Math. 1]
$$\beta = (B_{exp}^2 - B_i^2)^{1/2} \quad (1)$$

β: Spread of diffraction line by crystallite (rad)
$B_{exp}$: Diffraction angle by measurement (rad)
$B_i$: Spread of diffraction line by instrument (rad)

$$D = \frac{K\lambda}{\beta \cos\theta} \quad (2)$$

D: Particle diameter (nm)
K: Scherrer constant 0.94
λ: Wavelength of X-ray (nm)
β: Spread of diffraction line (rad)
θ: Diffraction angle (rad)

In the present embodiment, the material having the largest average particle diameter is preferably a hole transportable material having crystallinity. The reason for this is that, in the organic photoelectric conversion layer 16 in the present embodiment, hole mobility of holes generated by exciton dissociation to an anode is improved with an increase in particle diameter of the hole transportable material having crystallinity. In addition, the material B having the second largest average particle diameter is preferably fullerene or a derivative thereof. The material C having the smallest average particle diameter is preferably a light absorber. The reason for this is that the light absorber is easily uniformly dispersed in the organic photoelectric conversion layer 16.

A thickness of the organic photoelectric conversion layer 16 is, for example, from 50 nm to 500 nm.

The upper electrode 17 includes an electrically conductive film having light transmissivity, as with the lower electrode 15. In the solid-state imaging apparatus 1 using the photoelectric conversion element 10 as one pixel, the upper electrode 17 may be separately provided for each of the pixels, or may be formed as a common electrode for the respective pixels. A thickness of the upper electrode 17 is, for example, from 10 nm to 200 nm both inclusive.

It is to be noted that any other layer may be provided between the organic photoelectric conversion layer 16 and the lower electrode 15 and between the organic photoelectric conversion layer 16 and the upper electrode 17. Specifically, for example, an undercoat film, a hole transport layer, an electron blocking film, the organic photoelectric conversion layer 16, a hole blocking layer, a buffer film, an electron transport layer, a work function adjustment film, and the like may be stacked in order from the lower electrode 15.

The fixed charge layer 12A may be a film having positive fixed charges or a film having negative fixed charges. Examples of a material of the film having the negative fixed charges include hafnium oxide, aluminum oxide, zirconium oxide, tantalum oxide, titanium oxide, and the like. In addition, as a material other than the above-described materials, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, an aluminum oxynitride film, or the like may also be used.

The fixed charge layer 12A may have a configuration in which two or more kinds of films are stacked. This makes it possible to further enhance a function as a hole accumulation layer, for example, in the case of the film having the negative fixed charges.

Although a material of the dielectric layer 12B is not specifically limited, the dielectric layer 12B is formed using, for example, a silicon oxide film, TEOS, a silicon nitride film, a silicon oxynitride film, or the like.

The interlayer insulation layer 14 includes, for example, a single-layer film including one kind of silicon oxide, silicon nitride, silicon oxynitride (SiON), and the like, or a stacked film including two or more kinds thereof.

The protective layer 18 includes a material having light transmissivity, and includes, for example, a single-layer film including one of silicon oxide, silicon nitride, silicon oxynitride, and the like, or a stacked film including two or more kinds thereof. A thickness of the protective layer 18 is, for example, from 100 nm to 30000 nm.

The on-chip lens layer 19 is formed on the protective layer 18 to cover an entire surface of the protective layer 18. A plurality of on-chip lenses 19L (microlenses) is provided on a front surface of the on-chip lens layer 19. The on-chip lenses 19L concentrates light incoming from above the on-chip lenses 19L onto each of light reception surfaces of the organic photoelectric converter 11G and the inorganic photoelectric converters 11B and 11R. In the present embodiment, the multilayer wiring 70 is formed on the second surface 11S2 side of the semiconductor substrate 11, which makes it possible to dispose the respective light reception surfaces of the organic photoelectric converter 11G and the inorganic photoelectric converters 11B and 11R close to one another, and to reduce variation in sensitivity between respective colors that is caused depending on an F-number of the on-chip lenses 19L.

FIG. 2 is a plan view of a configuration example of a photoelectric conversion element including a pixel in which a plurality of photoelectric converters (for example, the inorganic photoelectric converters 11B and 11R and the organic photoelectric converter 11G described above) to which the technology according to the present disclosure is applicable are stacked. That is, FIG. 2 illustrates an example of a planar configuration of the unit pixel P included in a pixel section 1a illustrated in FIG. 7.

The unit pixel P includes a photoelectric conversion region 1100 in which a red photoelectric converter (the inorganic photoelectric converter 11R in FIG. 1), a blue photoelectric converter (the inorganic photoelectric converter 11B in FIG. 1), and a green photoelectric converter (the organic photoelectric converter 11G in FIG. 1) that respectively perform photoelectric conversion of light of wavelengths of R (Red), G (Green), and B (Blue) (any of them is not illustrated in FIG. 2) are stacked in three layers in order of the green photoelectric converter, the blue photoelectric converter, and the red photoelectric converter from a light reception surface (the light incident surface S1 in FIG. 1) side, for example. Further, the unit pixel P includes a Tr group 1110, a Tr group 1120, and a Tr group 1130 as charge readout sections that respectively read charges corresponding to light of wavelengths of R, G, and B from the red photoelectric converter, the green photoelectric converter, and the blue photoelectric converter. In the solid-state imaging apparatus 1, in one unit pixel, dispersion in the longitudinal direction, that is, dispersion of light of RGB is respectively performed in the layers as the red photoelectric converter, the green photoelectric converter, and the blue photoelectric converter stacked in the photoelectric conversion region 1100.

The Tr group 1110, the Tr group 1120, and the Tr group 1130 are formed on the periphery of the photoelectric conversion region 1100. The Tr group 1110 outputs, as a pixel signal, signal charges corresponding to light of R generated and accumulated in the red photoelectric converter. The Tr group 1110 includes a transfer Tr (MOS FET) 1111, a reset Tr 1112, an amplification Tr 1113, and a selection Tr 1114. The Tr group 1120 outputs, as a pixel signal, signal charges corresponding to light of B generated and accumulated in the blue photoelectric converter. The Tr group 1120 includes a transfer Tr 1121, a reset Tr 1122, an amplification Tr 1123, and a selection Tr 1124. The Tr group 1130 outputs, as a pixel signal, signal charges corresponding to light of G generated and accumulated in the green photoelectric converter. The Tr group 1130 includes a transfer Tr 1131, a reset Tr 1132, an amplification Tr 1133, and a selection Tr 1134.

The transfer Tr 1111 includes a gate G, a source/drain region S/D, and an FD (floating diffusion) 1115 (source/drain region serving as the FD 1115). The transfer Tr 1121 includes the gate G, the source/drain region S/D and an FD 1125. The transfer Tr 1131 includes the gate G, the green photoelectric converter (that is, the source/drain region S/D coupled to the green photoelectric converter) in the photoelectric conversion region 1100, and an FD 1135. It is to be noted that the source/drain region of the transfer Tr 1111 is coupled to the red photoelectric converter in the photoelectric conversion region 1100, and the source/drain region S/D of the transfer Tr 1121 is coupled to the blue photoelectric converter in the photoelectric conversion region 1100.

Each of the reset Trs 1112, 1132, and 1122, the amplification Trs 1113, 1133, and 1123, and the selection Trs 1114, 1134, and 1124 includes the gate G and a pair of source/drain regions S/D that are disposed to interpose the gate G therebetween.

The FDs 1115, 1135, and 1125 are respectively coupled to the source/drain regions S/D serving as sources of the reset Trs 1112, 1132, and 1122, and are respectively coupled to the gates G of the amplification Trs 1113, 1133, and 1123. A power source Vdd is coupled to each of the source/drain region S/D common to the reset Tr 1112 and the amplification Tr 1113, the source/drain region S/D common to the reset Tr 1132 and the amplification Tr 1133, and the source/drain region S/D common to the reset Tr 1122 and the amplification Tr 1123. A VSL (vertical signal line) is coupled to each of the source/drain regions S/D serving as sources of the selection Trs 1114, 1134, and 1124.

The technology according to the present disclosure is applicable to the photoelectric conversion element described above.

(1-2. Method of Manufacturing Photoelectric Conversion Element)

It is possible to manufacture the photoelectric conversion element 10 according to the present embodiment in the following manner, for example.

FIGS. 3 and 4 illustrate a method of manufacturing the photoelectric conversion element 10 in process order. First, as illustrated in FIG. 3, for example, the p-well 61 is formed as a well of a first conductivity type in the semiconductor substrate 11, and the inorganic photoelectric converters 11B and 11R of a second conductivity type (for example, the n type) are formed in this p-well 61. A p+ region is formed in the vicinity of the first surface 11S1 of the semiconductor substrate 11.

Similarly, as illustrated in FIG. 3, on the second surface 11S2 of the semiconductor substrate 11, n+ regions serving as the floating diffusions FD1 to FD3 are formed, and thereafter, a gate wiring layer 62, and a gate wiring layer 64 including respective gates of the vertical transistor Tr1, the transfer transistor Tr2, the amplifier transistor AMP, and the reset transistor RST are formed. Thus, the vertical transistor Tr1, the transfer transistor Tr2, the amplifier transistor AMP, and the reset transistor RST are formed. Furthermore, the multilayer wiring 70 including the first lower contact 75, the second lower contact 76, the wiring layers 71 to 73 including the coupling section 71A, and the insulation layer 74 is formed on the second surface 11S2 of the semiconductor substrate 11.

As a base substrate of the semiconductor substrate 11, an SOI (Silicon on Insulator) substrate in which the semiconductor substrate 11, an embedded oxide film (not illustrated), and a retaining substrate (not illustrated) are stacked is used. The embedded oxide film and the retaining substrate are not illustrated in FIG. 3, but are joined to the first surface 11S1 of the semiconductor substrate 11. Annealing treatment is performed after ion implantation.

Next, a supporting substrate (not illustrated), another semiconductor substrate, or the like is joined to the second surface 11S2 side of the semiconductor substrate 11 (on the multilayer wiring 70 side) and flipped from top to bottom. Subsequently, the semiconductor substrate 11 is separated from the embedded oxide film and the retaining substrate of the SOI substrate to cause the first surface 11S1 of the semiconductor substrate 11 to be exposed. It is possible to perform the above processes with technologies used in a typical CMOS process such as ion implantation and CVD (Chemical Vapor Deposition).

Next, as illustrated in FIG. 4, the semiconductor substrate 11 is processed from the first surface 11S1 side by dry etching, for example, to form an annular opening 63H. As illustrated in FIG. 4, a depth of the opening 63H preferably penetrates from the first surface 11S1 to the second surface 11S2 of the semiconductor substrate 11 and reaches the coupling section 71A, for example.

Subsequently, as illustrated in FIG. 4, for example, the negative fixed charge layer 12A is formed on the first surface 11S1 of the semiconductor substrate 11 and a side surface of the opening 63H. Two or more kinds of films may be stacked as the negative fixed charge layer 12A. This makes it possible to further enhance a function as the hole accumulation layer. After the negative fixed charge layer 12A is formed, the dielectric layer 12B is formed.

Subsequently, the opening 63H is filled with an electrical conductor to form the through electrode 63. As the electrical conductor, other than a doped silicon material such as PDAS (Phosphorus Doped Amorphous Silicon), it is possible to use a metal material such as aluminum (Al), tungsten (W), titanium (Ti), cobalt (Co), hafnium (Hf), and tantalum (Ta).

Subsequently, a pad section 13A is formed on the through electrode 63, and thereafter, the interlayer insulating layer 14 is formed on the dielectric layer 12B and the pad section 13A. In the interlayer insulating layer 14, the upper contact 13B and a pad section 13C that electrically couple the lower electrode 15 and the through electrode 63 (specifically the pad section 13A on the through electrode 63) to each other are provided on the pad section 13A.

Subsequently, the lower electrode 15, the organic photoelectric conversion layer 16, the upper electrode 17, and the protective layer 18 are formed in this order on the interlayer insulating layer 14. The organic photoelectric conversion layer 16 is formed, for example, by forming films of the three kinds of organic semiconductor materials described above with use of a vacuum evaporation method, for example. Lastly, the on-chip lens layer 19 including a plurality of on-chip lenses 19L is disposed on the surface. Thus, the photoelectric conversion element 10 illustrated in FIG. 1 is completed.

It is to be noted that, in a case where other organic layers (for example, the electron blocking layer, and the like) are formed above or below the organic photoelectric conversion layer 16 as described above, it is desirable to form the organic layers continuously (by an in-situ vacuum process). In addition, a method of forming the organic photoelectric conversion layer 16 is not necessarily limited to a technique using a vacuum evaporation method, and, other techniques, for example, a spin coat technology, a printing technology, etc. may also be used.

In the photoelectric conversion element 10, in a case where light enters the organic photoelectric converter 11G via the on-chip lenses 19L, the light passes through the organic photoelectric converter 11G and the inorganic photoelectric converters 11B and 11R in order, and each of green light, blue light, and red light is photoelectrically converted in the course of passing. In the following, signal acquisition operations of the respective colors are described.

(Acquisition of Green Signal by Organic Photoelectric Converter 11G)

Of light having entered the photoelectric conversion element 10, first, green light is selectively detected (absorbed) and photoelectrically converted in the organic photoelectric converter 11G.

The organic photoelectric converter 11G is coupled to the gate Gamp of the amplifier transistor AMP and the floating diffusion FD3 via the through electrode 63. Thus, electrons of electron-hole pairs generated in the organic photoelectric converter 11G are extracted from the lower electrode 15 side, transferred to the second surface 11S2 side of the semiconductor substrate 11 via the through electrode 63, and accumulated in the floating diffusion FD3. Simultaneously with this, the amount of charges generated in the organic photoelectric converter 11G is modulated into voltage by the amplifier transistor AMP.

In addition, the reset gate Grst of the reset transistor RST is disposed adjacent to the floating diffusion FD3. Accordingly, the charges accumulated in the floating diffusion FD3 are reset by the reset transistor RST.

Herein, the organic photoelectric converter 11G is coupled not only to the amplifier transistor AMP but also to the floating diffusion FD3 via the through electrode 63, thus making it possible for the reset transistor RST to easily reset the charges accumulated in the floating diffusion FD3.

In contrast to this, in a case where the through electrode 63 is not coupled to the floating diffusion FD3, it is difficult to reset the charges accumulated in the floating diffusion FD3, causing the charges to be drawn to the upper electrode 17 side by application of a large voltage. This may damage the organic photoelectric conversion layer 16. In addition, a configuration that enables resetting in a short period of time causes an increase in dark time noise, thereby resulting in a trade-off; therefore, this configuration is difficult.

(Acquisition of Blue Signal and Red Signal by Inorganic Photoelectric Converters 11B and 11R)

Subsequently, blue light and red light of the light having passed through the organic photoelectric converter 11G are absorbed and photoelectrically converted in sequence respectively in the inorganic photoelectric converter 11B and the inorganic photoelectric converter 11R. In the inorganic photoelectric converter 11B, electrons corresponding to the incident blue light are accumulated in the n region of the inorganic photoelectric converter 11B, and the accumulated electrons are transferred to the floating diffusion FD1 by the vertical transistor Tr1. Similarly, in the inorganic photoelectric converter 11R, electrons corresponding to the incident red light are accumulated in the n region of the inorganic photoelectric converter 11R, and the accumulated electrons are transferred to the floating diffusion FD2 by the transfer transistor Tr2.

(1-3. Workings and Effects)

As described above, the organic photoelectric conversion element used in an organic thin-film solar cell, an organic imaging element, or the like adopts a bulk heterostructure in which a p-type organic semiconductor and an n-type organic semiconductor are mixed, and the organic photoelectric conversion layer includes a plurality of kinds of organic semiconductor materials. Thus, in the organic photoelectric conversion element including the organic photoelectric conversion layer in which a plurality of kinds of organic semiconductor materials is mixed, occurrence of a device failure resulting from a short circuit or the like between a pair of electrodes opposed to each other with the organic photoelectric conversion layer interposed therebetween has become an issue, and an improvement in reliability is desired.

In contrast, in the present embodiment, as the materials included in the organic photoelectric conversion layer 16, fullerene or a derivative thereof, the organic semiconductor material having crystallinity, and the material (light absorber) having an absorption maximum wavelength in a selective wavelength region are used, and have average particle diameters different from each other.

FIG. 5A schematically illustrates a layer structure of a typical organic photoelectric conversion layer 160 formed using three kinds of organic semiconductor materials (a material A', a material B', and a material C') having average particle diameters that are not much different from each other. FIG. 5B schematically illustrates a layer structure of the organic photoelectric conversion layer 16 in the present embodiment. The organic photoelectric conversion layer 160 illustrated in FIG. 5A has a large number of gaps between the three kinds of organic semiconductor materials that are mixed. That is, the typical organic photoelectric conversion layer 160 is a coarse film having a large number of voids. In an organic photoelectric conversion element including such a coarse organic photoelectric conversion layer 160 having a large number of voids, after formation of the organic photoelectric conversion layer 160, damage by formation of an electrode on the layer and a load of annealing or the like in the formation of the electrode causes film deformation such as formation of an uneven surface in the organic photoelectric conversion layer 16. This film deformation causes a short circuit or the like between electrodes between which the organic photoelectric conversion layer 160 is interposed, thereby resulting in a device failure.

In contrast, in the present embodiment, as illustrated in FIG. 5B, the material C having a small particle diameter enters into voids formed by the material A and the material B that have relatively large particle diameters to fill gaps formed by the material A and the material B. This makes it possible to obtain the dense organic photoelectric conversion layer 16 having less voids.

As described above, in the photoelectric conversion element 10 according to the present embodiment, the organic photoelectric conversion layer 16 is formed using the organic semiconductor materials having average particle diameters different from each other, thereby forming a dense organic photoelectric conversion layer having less voids. This makes it possible to provide a photoelectric conversion element under an improvement in reliability and the solid-state imaging apparatus 1 including the photoelectric conversion element.

Next, description is given of a modification example of the present disclosure. It is to be noted that components corresponding to those of the photoelectric conversion element 10 according to the above-described embodiment are denoted by the same reference numerals, and description thereof is omitted.

2. Modification Examples

FIG. 6 illustrates a cross-sectional configuration of a photoelectric conversion element (photoelectric conversion element 20) according to a modification example of the present disclosure. The photoelectric conversion element 20 is an imaging element included in one unit pixel P of a solid-state imaging element (solid-state imaging apparatus 1) such as a back-side illumination type CCD image sensor or a CMOS image sensor, as with the photoelectric conversion element 10 according to the above-described embodiment and the like. The photoelectric conversion element 20 according to the present modification example has a configuration in which a red photoelectric converter 40R, a green photoelectric converter 40G, and a blue photoelectric converter 40B are stacked in this order on a silicon substrate 81 with an insulating layer 82 interposed therebetween.

The red photoelectric converter 40R, the green photoelectric converter 40G, and the blue photoelectric converter 40B respectively include organic photoelectric conversion layers 42R, 42G, and 42B between a pair of electrodes, specifically, between a first electrode 41R and a second electrode 43R, between a first electrode 41G and a second electrode 43G, and between a first electrode 41B and a second electrode 43B. The organic photoelectric conversion layers 42R, 42G, and 42B each include a ChDT derivative, which makes it possible to achieve effects similar to those in the above-described embodiment.

The photoelectric conversion element 20 has a configuration in which the red photoelectric converter 40R, the green photoelectric converter 40G, and the blue photoelectric converter 40B are stacked on the silicon substrate 81 with the insulating layer 82 interposed therebetween, as described above. The on-chip lenses 19L are provided on the blue photoelectric converter 40B with the protective layer 18 and the on-chip lens layer 19 interposed therebetween. A red storage layer 210R, a green storage layer 210G, and a blue storage layer 210B are provided in the silicon substrate 81. Light having entered the on-chip lenses 19L is photoelectrically converted by the red photoelectric converter 40R, the green photoelectric converter 40G, and the blue photoelectric converter 40B, and signal charges are transmitted each from the red photoelectric converter 40R to the red storage layer 210R, from the green photoelectric converter 40G to the green storage layer 210G, and from the blue photoelectric converter 40B to the blue storage layer 210B. The signal charges may be electrons or holes generated by photoelectric conversion, but a case where electrons are read as signal charges is described as an example below.

The silicon substrate 81 includes, for example, a p-type silicon substrate. The red storage layer 210R, the green storage layer 210G, and the blue storage layer 210B provided in the silicon substrate 81 each include an n-type semiconductor region, and signal charges (electrons) supplied from the red photoelectric converter 40R, the green photoelectric converter 40G, and the blue photoelectric converter 40B are accumulated in the n-type semiconductor regions. The n-type semiconductor regions of the red storage layer 210R, the green storage layer 210G, and the blue storage layer 210B are formed by doping the silicon substrate 81 with an n-type impurity such as phosphorus (P) or arsenic (As), for example. It is to be noted that the silicon substrate 81 may be provided on a supporting substrate (not illustrated) including glass or the like.

In the silicon substrate 81, a pixel transistor is provided. The pixel transfer is used to read electrons from each of the red storage layer 210R, the green storage layer 210G, and the blue storage layer 210B and transfer the electrons to a vertical signal line (vertical signal line Lsig in FIG. 8 to be described later), for example. A floating diffusion of the pixel transistor is provided in the silicon substrate 81, and the floating diffusion is coupled to the red storage layer 210R, the green storage layer 210G, and the blue storage layer 210B. The floating diffusion includes an n-type semiconductor region.

The insulating layer 82 includes, for example, silicon oxide, silicon nitride, silicon oxynitride, hafnium oxide, and the like. The insulating layer 82 may be configured by stacking a plurality of kinds of insulating films. The insulating layer 82 may include an organic insulating material. The insulating layer 82 includes respective plugs for coupling between the red storage layer 210R and the red photoelectric converter 40R, between the green storage layer 210G and the green photoelectric converter 40G, and between the blue storage layer 210B and the blue photoelectric converter 40B, and electrodes.

The red photoelectric converter 40R includes the first electrode 41R, the organic photoelectric conversion layer 42R, and the second electrode 43R in this order from a position close to the silicon substrate 81. The green photoelectric converter 40G includes the first electrode 41G, the organic photoelectric conversion layer 42G, and the second electrode 43G in this order from a position close to the red photoelectric converter 40R. The blue photoelectric converter 40B includes the first electrode 41B, the organic photoelectric conversion layer 42B, and the second electrode 43B in this order from a position close to the green photoelectric converter 40G. An insulating layer 44 is provided between the red photoelectric converter 40R and the green photoelectric converter 40G, and an insulating layer 45 is provided between the green photoelectric converter 40G and the blue photoelectric converter 40B. The red photoelectric converter 40R, the green photoelectric converter 40G, and the blue photoelectric converter 40B respectively selectively absorb red (for example, a wavelength of 600 nm or greater and less than 700 nm) light, green (for example, a wavelength of 480 nm or greater and less than 600 nm) light, and blue (for example, a wavelength of 400 or greater and less than 480 nm) light to generate electron-hole pairs.

The first electrode 41R, the first electrode 41G, and the first electrode 41B respectively extract signal charges generated in the organic photoelectric conversion layer 42R, signal charges generated in the organic photoelectric conversion layer 42G, and signal charges generated in the organic photoelectric conversion layer 42B. The first electrodes 41R, 41G, and 41B are provided for each pixel, for example. The first electrodes 41R, 41G, and 41B include, for example, an electrically conductive material having light transmissivity, and specifically ITO. The first electrodes 41R, 41G, and 41B may include, for example, a tin oxide-based material or a zinc oxide-based material. The tin oxide-based material is tin oxide to which a dopant is added, and examples of the zinc oxide-based material include aluminum zinc oxide prepared by adding aluminum as a dopant to zinc oxide, gallium zinc oxide prepared by adding gallium as a dopant to zinc oxide, indium zinc oxide prepared by adding indium as a dopant to zinc oxide, and the like. Other than these materials, it is possible to use IGZO, CuI, InSbO$_4$, ZnMgO, CuInO$_2$, MgIn$_2$O$_4$, CdO, ZnSnO$_3$, and the like. A thickness of each of the first electrodes 41R, 41G, and 41B is, for example, from 50 nm to 500 nm.

An electron transport layer may be provided each between the first electrode 41R and the organic photoelectric conversion layer 42R, between the first electrode 41G and the organic photoelectric conversion layer 42G, and between the first electrode 41B and the organic photoelectric conversion layer 42B, for example. The electron transport layer serves to promote supplying of electrons generated in the organic photoelectric conversion layers 42R, 42G, and 42B to the first electrodes 41R, 41G, and 41B, and includes, for example, titanium oxide, zinc oxide, or the like. The electron transport layer may be configured by stacking titanium oxide and zinc oxide. A thickness of the electron transport layer is, for example, from 0.1 nm to 1000 nm, and preferably from 0.5 nm to 300 nm.

The organic photoelectric conversion layers 42R, 42G, and 42B each absorb light in a selective wavelength region for photoelectric conversion, and allow light in another wavelength region to pass therethrough. Herein, the light in the selective wavelength region is, for example, light in a wavelength region from a wavelength of 600 nm or greater and less than 700 nm for the organic photoelectric conversion layer 42R, light in a wavelength region from a wavelength of 480 nm and less than 600 nm for the organic photoelectric conversion layer 42G, and light in a wavelength region from a wavelength of 400 nm or greater and less than 480 nm for the organic photoelectric conversion layer 42B. A thickness of each of the organic photoelectric conversion layers 42R, 42G, and 42B is, for example, from 50 nm to 500 nm both inclusive.

The organic photoelectric conversion layers 42R, 42G, and 42B each include, for example, two or more types of organic semiconductor materials, as with the organic photoelectric conversion layer 16 in the above-described embodiment, and preferably includes, for example, one or both of a p-type semiconductor and an n-type semiconductor. For example, in a case where each of the organic photoelectric conversion layers 42R, 42G, and 42B includes two kinds of organic semiconductor materials, that is, the p-type semiconductor and the n-type semiconductor, for example, one of the p-type semiconductor and the n-type semiconductor is preferably a material having transmissivity to visible light, and the other is preferably a material that performs photoelectric conversion of light in a selective wavelength region (for example, from 450 nm to 650 nm both inclusive). Alternatively, each of the organic photoelectric conversion layers 42R, 42G, and 42B preferably includes three kinds of organic semiconductor materials, that is, a material (light absorber) that performs photoelectric conversion of light in a selective wavelength region corresponding to each layer, and the n-type semiconductor and the p-type semiconductor having transmissivity to visible light.

Each of the organic photoelectric conversion layers 42R, 42G, and 42B is preferably formed using materials having average particle diameters different from each other, as with the organic photoelectric conversion layer 16 in the above-described embodiment. Specifically, Each of the organic photoelectric conversion layers 42R, 42G, and 42Bs preferably uses fullerene or a derivative thereof, a hole transportable material having crystallinity, and a material (light absorber) having an absorption maximum wavelength in a selective wavelength region, which have average particle diameters different from each other.

Examples of the light absorber used for the organic photoelectric conversion layers 42R, 42G, and 42B include the following materials. Examples of the light absorber for the organic photoelectric conversion layer 42R include subnaphthalocyanine represented by the following general expression (4) or a derivative thereof, and phthalocyanine represented by the following expression (5) or a derivative thereof. Examples of the light absorber for the organic photoelectric conversion layer 42G include subphthalocyanine represented by the general expression (3) in the above-described embodiment or a derivative thereof. Examples of the light absorber for the organic photoelectric conversion layer 42B include coumarin represented by the following general expression (6) or a derivative, and porphyrin represented by the following general expression (7) or a derivative thereof. Using the materials described above makes it possible to selectively perform photoelectric conversion of red light, green light, and blue light respectively by the organic photoelectric conversion layer 42R, the organic photoelectric conversion layer 42G, and the organic photoelectric conversion layer 42B.

[Chem. 3]

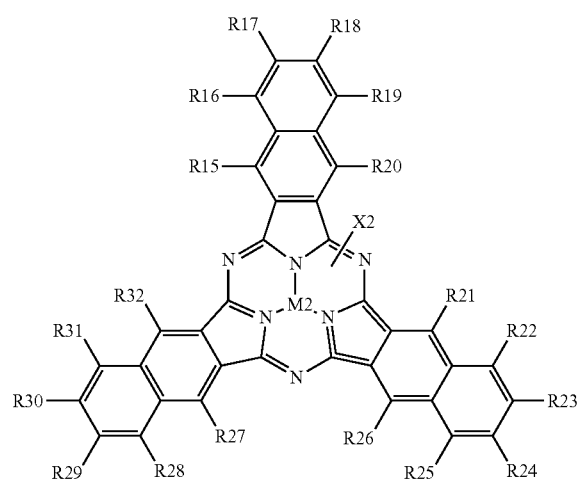

(4)

(R15 to R32 are each independently selected from a group configured of a hydrogen atom, a halogen atom, a straight-chain, branched, or cyclic alkyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a phenyl group, a carboxy group, a carboxamide group, a carboalkoxy group, an acyl group, a sulfonyl group, a cyano group, and a nitro group, and any adjacent ones of R15 to R32 are optionally part of a condensed aliphatic ring or a condensed aromatic ring. The condensed aliphatic ring or the condensed aromatic ring described above optionally includes one or a plurality of atoms other than carbon. M2 is boron or a divalent or trivalent metal. X2 is a substituent group of one selected from a group configured of a halogen, a hydroxy group, a thiol group, an imide group, a substituted or unsubstituted alkoxy group, a substituted or unsubstituted aryloxy group, a substituted or unsubstituted alkyl group, a substituted or unsubstituted alkylthio group, and a substituted or unsubstituted arylthio group.)

[Chem. 4]

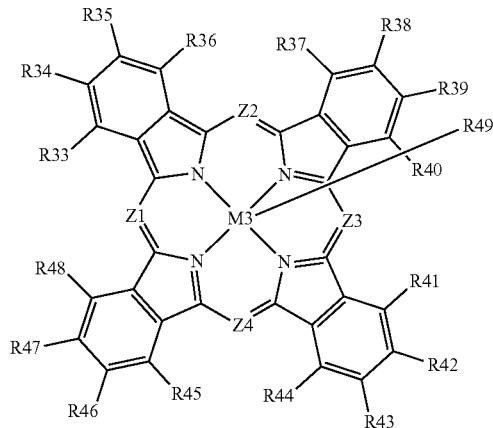

(5)

(R33 to R48 are each independently a hydrogen atom, a halogen atom, a straight-chain, branched, or cyclic alkyl group, an aryl group, a partial fluoroalkyl group, a perfluoroalkyl group, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a carboxy group, a carboxamide group, a carboalkoxy group, an acyl group, a sulfonyl group, a cyano group, and a nitro group. Any adjacent ones of R33 to R48 are optionally bound to one another to form a condensed aliphatic ring or a condensed aromatic ring. The condensed aliphatic ring or condensed aromatic ring optionally include one or a plurality of atoms other than carbon. Z1 to Z4 are each independently a nitrogen atom, and R49 is a hydrogen atom, a halogen atom, a straight-chain, branched, or cyclic alkyl group, an aryl group, a partial fluoroalkyl group, a perfluoroalkyl group, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a carboxy group, a carboxamide group, a carboalkoxy group, an acyl group, a sulfonyl group, a cyano group, and a nitro group. M3 is boron or a divalent or trivalent metal.)

[Chem. 5]

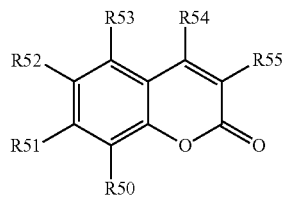

(6)

(R50 to R55 are each independently a hydrogen atom, a halogen atom, a straight-chain, branched, or cyclic alkyl group, an aryl group, a partial fluoroalkyl group, a perfluoroalkyl group, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a carboxy group, a carboxamide group, a carboalkoxy group, a acyl group, a sulfonyl group, a cyano group, and a nitro group. Any adjacent ones of R50 to R55 are optionally bound to one another to form a condensed aliphatic ring or a condensed aromatic ring. The condensed aliphatic ring or condensed aromatic ring optionally include one or a plurality of atoms other than carbon.)

[Chem. 6]

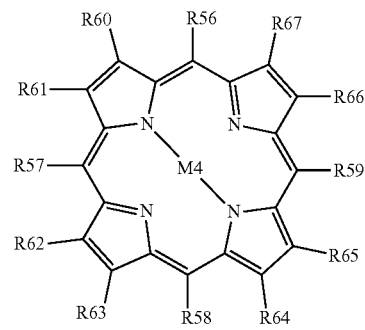

(7)

(R56 to R67 are each independently a hydrogen atom, a halogen atom, a straight-chain, branched, or cyclic alkyl group, an aryl group, a partial fluoroalkyl group, a perfluoroalkyl group, a silyl alkyl group, a silyl alkoxy group, an aryl silyl group, a thioalkyl group, a thioaryl group, an aryl sulfonyl group, an alkyl sulfonyl group, an amino group, an alkyl amino group, an aryl amino group, a hydroxy group, an alkoxy group, an acyl amino group, an acyloxy group, a carboxy group, a carboxamide group, a carboalkoxy group, an acyl group, a sulfonyl group, a cyano group, and a nitro group. Any adjacent ones of R56 to R67 are optionally bound to one another to form a condensed aliphatic ring or a condensed aromatic ring. The condensed aliphatic ring or condensed aromatic ring optionally include one or a plurality of atoms other than carbon. M4 is a metal, a metal halide, a metal oxide, a metal hydride, or two hydrogens.)

A hole transport layer may be provided each between the organic photoelectric conversion layer 42R and the second electrode 43R, between the organic photoelectric conversion layer 42G and the second electrode 43G, and between the organic photoelectric conversion layer 42B and the second electrode 43B, for example. The hole transport layer serves to promote supplying of holes generated in the organic photoelectric conversion layers 42R, 42G, and 42B to the second electrodes 43R, 43G, and 43B, and includes, for example, molybdenum oxide, nickel oxide, vanadium oxide, or the like. The hole transport layer may include an organic material such as PEDOT (Poly(3,4-ethylenedioxythiophene)) and TPD (N,N'-Bis(3-methylphenyl)-N,N'-diphenylbenzidine). A thickness of the hole transport layer is, for example, from 0.5 nm to 100 nm both inclusive.

The second electrode 43R, the second electrode 43G, the second electrode 43B respectively serve to extract holes generated in the organic photoelectric conversion layer 42R, holes generated in the organic photoelectric conversion layer 42G, and holes generated in the organic photoelectric conversion layer 42B. The holes extracted from the second electrodes 43R, 43G, and 43B are discharged to, for example, the p-type semiconductor region (not illustrated) in the silicon substrate 81 through various transmission paths (not illustrated). The second electrodes 43R, 43G, and 43B include, for example, an electrically conductive material such as gold, silver, copper, and aluminum. As with the first electrodes 41R, 41G, and 41B, for example, the second electrodes 43R, 43G, and 43B may include, for example, a transparent electrically conductive film. In the photoelectric conversion element 20, the holes extracted from the second electrodes 43R, 43G, and 43B are discharged; therefore, in a case where a plurality of photoelectric conversion elements 20 is disposed in the solid-state imaging apparatus 1 to be described later, the second electrodes 43R, 43G, and 43B may be provided common to each of the photoelectric conversion elements 20 (unit pixels P). A thickness of each of the second electrodes 43R, 43G, and 43B is, for example, form 0.5 nm to 100 nm both inclusive.

The insulating layer 44 serves to insulate the second electrode 43R and the first electrode 41G from each other, and the insulating layer 45 serves to insulate the second electrode 43G and the first electrode 41B from each other. The insulating layers 44 and 45 include, for example, a metal oxide, a metal sulfide, or an organic substance. Examples of the metal oxide include silicon oxide, aluminum oxide, zirconium oxide, titanium oxide, zinc oxide, tungsten oxide, magnesium oxide, niobium oxide, tin oxide, gallium oxide, and the like. Examples of the metal sulfide include zinc sulfide, magnesium sulfide, and the like. A band gap of a constituent material of each of the insulating layers 44 and 45 is preferably 3.0 eV or greater. A thickness of each of the insulating layers 44 and 45 is, for example, from 2 nm to 100 nm both inclusive.

As described above, the organic photoelectric conversion layers 42R (and 42G and 42B) are each formed using the organic semiconductor materials having average particle diameters different from each other, which forms a dense organic photoelectric conversion layer having less voids. This makes it possible to provide a photoelectric conversion element under an improvement in reliability and the solid-state imaging apparatus 1 including the photoelectric conversion element.

3. Application Example

Application Example 1

FIG. 7 illustrates an overall configuration of the solid-state imaging apparatus 1 using, for each of the pixels, the photoelectric conversion element 10 described in the above-described embodiment. The solid-state imaging apparatus 1 is a CMOS image sensor, and includes, on the semiconductor substrate 11, a pixel section 1a as an imaging region and a peripheral circuit section 130 including, for example, a row scanner 131, a horizontal selector 133, a column scanner 134, and a system controller 132 in a peripheral region of the pixel section 1a.

The pixel section 1a has a plurality of unit pixels P (each corresponding to the photoelectric conversion element 10) two-dimensionally arranged in a matrix, for example. The unit pixels P are wired with pixel drive lines Lread (specifically, row selection lines and reset control lines) for respective pixel rows, and vertical signal lines Lsig for respective pixel columns, for example. The pixel drive lines Lread transmit drive signals for signal reading from the pixels. The pixel drive lines Lread each have one end coupled to a corresponding one of output terminals, corresponding to the respective rows, of the row scanner 131.

The row scanner 131 includes a shift register, an address decoder, and the like, and is a pixel driver, for example, that drives the respective unit pixels P in the pixel section 1a on a row-by-row basis. A signal outputted from each of the unit pixels P of a pixel row selectively scanned by the row scanner 131 is supplied to the horizontal selector 133 through each of the vertical signal lines Lsig. The horizontal selector 133 includes an amplifier, a horizontal selection switch, and the like provided for each of the vertical signal lines Lsig.

The column scanner 134 includes a shift register, an address decoder, and the like, and drives respective horizontal selection switches of the horizontal selector 133 in sequence while scanning the horizontal selection switches. Such selective scanning by the column scanner 134 causes the signals of the respective pixels transmitted through the respective vertical signal lines Lsig to be outputted in sequence to a horizontal signal line 135 and thereafter transmitted to outside of the semiconductor substrate 11 through the horizontal signal line 135.

Circuit components including the row scanner 131, the horizontal selector 133, the column scanner 134, and the horizontal signal line 135 may be formed directly on the semiconductor substrate 11 or disposed in an external control IC. Alternatively, these circuit components may be formed in any other substrate coupled by a cable, or the like.

The system controller 132 receives a clock given from the outside of the semiconductor substrate 11, or data or the like on instructions of operation modes, and also outputs data such as internal information of the solid-state imaging apparatus 1. The system controller 132 further has a timing generator that generates various timing signals, and performs drive control of the peripheral circuits such as the row scanner 131, the horizontal selector 133, and the column scanner 134, on the basis of the various timing signals generated by the timing generator.

Application Example 2

The above-described solid-state imaging apparatus 1 is applicable to, for example, various kinds of electronic apparatuses having imaging functions. Examples of the electronic apparatuses include camera systems such as digital still cameras and video cameras and mobile phones having the imaging functions. FIG. 8 illustrates, for purpose of an example, a schematic configuration of a camera 2. The camera 2 is a video camera that enables shooting of a still image or a moving image, for example, and includes the solid-state imaging apparatus 1, an optical system (optical lens) 310, a shutter apparatus 311, a driver 313 that drives the solid-state imaging apparatus 1 and the shutter apparatus 311, and a signal processor 312.

The optical system 310 guides image light (incident light) from an object to the pixel section 1a of the solid-state imaging apparatus 1. The optical system 310 may include a plurality of optical lenses. The shutter apparatus 311 controls a period in which the solid-state imaging apparatus 1 is irradiated with the light and a period in which the light is blocked. The driver 313 controls a transfer operation of the solid-state imaging apparatus 1 and a shutter operation of the shutter apparatus 311. The signal processor 312 performs various types of signal processing on signals outputted from the solid-state imaging apparatus 1. An image signal Dout having been subjected to the signal processing is stored in a storage medium such as a memory or outputted to a monitor, or the like.

Application Example 3

<Example of Application to In-Vivo Information Acquisition System>

The technology (present technology) according to the present disclosure is applicable to various products. For example, the technology according to the present disclosure may be applied to an endoscopic surgery system.

FIG. 9 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 9, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure is applicable has been described above. The technology according to the present disclosure is applicable to, for example, the image pickup unit 10112 of the configurations described above. This makes it possible to improve accuracy of an inspection.

Application Example 4

4. Example of Application to Endoscopic Surgery System

The technology (present technology) according to the present disclosure is applicable to various products. For example, the technology according to the present disclosure may be applied to an endoscopic surgery system.

FIG. 10 is a view depicting an example of a schematic configuration of an endoscopic surgery system to which the technology according to an embodiment of the present disclosure (present technology) can be applied.

In FIG. 10, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 11 is a block diagram depicting an example of a functional configuration of the camera head 11102 and the CCU 11201 depicted in FIG. 10.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure is applicable has been described above. The technology according to the present disclosure is applicable to, for example, the image pickup unit 11402 of the configurations described above. Applying the technology according to the present disclosure to the image pickup unit 11402 makes it possible to improve accuracy of an inspection.

It is to be noted that the endoscopic surgery system has been described here as an example, but the technology according to the present disclosure may be additionally applied to, for example, a microscopic surgery system and the like.

Application Example 5

<Example of Application to Mobile Body>

The technology according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, a robot, a construction machine, and an agricultural machine (tractor).

FIG. 12 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display and a head-up display.

FIG. 13 is a diagram depicting an example of the installation position of the imaging section 12031.

In FIG. 13, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 13 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

4. Examples

Next, examples of the present disclosure are described in detail below.

FIG. 14 is an XRD (θ-2θ) profile of a film of C60 fullerene formed by evaporation. As described above, the particle diameter of the organic semiconductor material is obtained by the Scherrer's equation (the above-described mathematical expression (2)). It is to be noted that, in the present example, a particle diameter calculated from the largest peak appearing in the XRD profile was regarded as the particle diameter of the organic semiconductor material. In FIG. 14, the largest peak was observed around 2θ=11°, and the particle diameter calculated by the Scherrer's equation was 8.67 nm.

FIG. 15 illustrates a relationship between particle diameters and surface roughness (Ra) of organic semiconductor materials (C60 fullerene, a hole transportable material having crystallinity, and a light absorber) included in an organic photoelectric conversion layer formed at a substrate temperature (film formation temperature) of 0° C. The particle diameters of the hole transportable material having crystallinity and the light absorber were calculated with use of the above-described particle diameter calculation method, and relative values of the particle diameters of C60 fullerene and the light absorber with respect to the hole transportable material having crystallinity were calculated, with the particle diameter of the hole transportable material having crystallinity being 1. Measurement of average surface roughness of the organic photoelectric conversion layer having various particle diameters showed that a dense organic photoelectric conversion layer having less voids (average surface roughness ≤2 nm) was obtained by using C60 fullerene having a particle diameter ratio of 0.6 with respect to the hole transporting material having crystallinity and the light absorber having a particle diameter ratio of 0.3 with respect to the hole transporting material having crystallinity. As can be seen from this result, in a case where the particle ratio of the light absorber with respect to the hole transporting material having crystallinity is 0.6 or less, a dense organic photoelectric conversion layer having less voids is obtained.

It is to be noted that the organic photoelectric conversion layer included 10 vol % to 35 vol % both inclusive of C60 fullerene and 10 vol % to 60 vol % both inclusive of the hole transportable material having crystallinity. The organic photoelectric conversion layer included 30 vol % to 80 vol % both inclusive of the light absorber. In addition, the surface roughness (Ra) is an average value of surface roughness measured in 0.001 mm (1 μm)×0.001 mm (1 μm) of each of formed organic layers, for example.

FIG. 16 is a summary of average surface roughness of organic photoelectric conversion layers formed under respective conditions (experimental examples 1 to 9). Table 1 is a summary of film formation temperatures, electrode materials of electrodes serving as substrates, and average surface roughness (Ra) in the experimental examples 1 to 9. It is to be noted that, in the experimental examples 1 to 6, AMF measurement was performed after storage for nine days in the air. In the experimental examples 7 to 9, AMF measurement was measured after storage for 0 days in the air. In addition, an i-layer film formation temperature (Ref) of the experimental example 1 was 0° C.

It was found out that the average surface roughness of the organic photoelectric conversion layer was changed by the film formation temperature (substrate temperature), and was not much changed by the kinds of substrates. In addition, it was found out that, in a case where the organic photoelectric conversion layers were formed by evaporation at substrate temperatures of 0° C., 25° C., and 40° C., there was a tendency that the average surface roughness was the smallest in a case where the organic photoelectric conversion layer was formed by evaporation at a substrate temperature of 25° C., and the second smallest in a case where the photoelectric conversion layer was formed by evaporation at a substrate temperature of 40° C., and the largest in a case where the organic photoelectric conversion layer was formed by evaporation at a substrate temperature of 0° C.

TABLE 1

| | Film Formation Temperature/ Electrode Material | Average Surface Roughness (Ra) |
|---|---|---|
| Experimental Example 1 | Ref/ITO | 1.91 |
| Experimental Example 2 | i Layer 25° C./ITO | 1.16 |
| Experimental Example 3 | i Layer 25° C./TEOS | 1.09 |
| Experimental Example 4 | i Layer 25° C., no HMDS/ITO | 1.07 |
| Experimental Example 5 | i Layer 40° C./ITO | 1.50 |
| Experimental Example 6 | i Layer 40° C./TEOS | 1.57 |
| Experimental Example 7 | i Layer 0° C. | 2.29 |
| Experimental Example 8 | i Layer 25° C. | 1.15 |
| Experimental Example 9 | i Layer 40° C. | 1.43 |

Although the description has been given by referring to the embodiment, the modification example, and the examples, the contents of the present disclosure are not limited to the above-described embodiment and the like, and may be modified in a variety of ways. For example, in the above-described embodiment, the photoelectric conversion element has a configuration in which the organic photoelectric converter 11G detecting green light and the inorganic photoelectric converters 11B and 11R respectively detecting blue light and red light are stacked; however, the contents of the present disclosure is not limited to such a configuration. That is, the organic photoelectric converter may detect red light or blue light, and the inorganic photoelectric converter may detect green light.

Further, the number of organic photoelectric converters, the number of inorganic photoelectric converters, a ratio between the organic photoelectric converters and the inorganic photoelectric converters are not limited, and two or more organic photoelectric converters may be provided, or color signals of a plurality of colors may be acquired only by the organic photoelectric converter. Furthermore, the content of the present disclosure is not limited to a configuration in which organic photoelectric converters and inorganic photoelectric converters are stacked in the longitudinal direction, and organic photoelectric converters and inorganic photoelectric converters may be arranged side by side along a substrate surface.

In addition, in the above-described embodiment and the like, the configuration of the back-side illumination type solid-state imaging apparatus has been exemplified; however, the contents of the present disclosure are applicable to a front-side illumination type solid-state imaging apparatus. Further, the photoelectric conversion element of the present disclosure does not necessarily include all of the respective components described in the above-described embodiment, or, conversely, may include any other layer.

It is to be noted that the effects described herein are merely illustrative and non-limiting, and other effects may be included.

It is to be noted that the present disclosure may have the following configurations.

(1)

A photoelectric conversion element including:
a first electrode;
a second electrode opposed to the first electrode; and
an organic photoelectric conversion layer provided between the first electrode and the second electrode and formed using a plurality of materials having average particle diameters different from each other, the plurality of materials including at least fullerene or a derivative thereof.

(2)

The photoelectric conversion element according to (1), in which at least one of the plurality of materials having the average particle diameters different from each other includes an organic semiconductor material having crystallinity.

(3)

The photoelectric conversion element according to (1) or (2), in which a particle diameter ratio of a material having a smallest average particle diameter with respect to a material having a largest average particle diameter in the plurality of materials having the average particle diameters different from each other is 0.6 or less.

(4)

The photoelectric conversion element according to any one of (1) to (3), in which average surface roughness Ra of the organic photoelectric conversion layer is 2 nm or less.

(5)

The photoelectric conversion element according to any one of (2) to (4), in which the organic semiconductor material having crystallinity includes an organic semiconductor material having hole transportability.

(6)

The photoelectric conversion element according to any one of (3) to (5), in which the organic photoelectric conversion layer includes fullerene or a fullerene derivative, an organic semiconductor material having hole transportability, and an organic semiconductor material having an absorption maximum wavelength in a selective wavelength region, and
the material having the largest average particle diameter includes the organic semiconductor material having hole transportability.

(7)

The photoelectric conversion element according to (6), in which the material having the smallest average particle diameter includes the organic semiconductor material having the absorption maximum wavelength in the selective wavelength region.

(8)

The photoelectric conversion element according to any one of (1) to (7), in which average particle diameters of the plurality of materials having the average particle diameters different from each other included in the organic photoelectric conversion layer are calculated with use of an X-ray diffraction (XRD) method.

(9)

The photoelectric conversion element according to (8), in which the average particle diameters of the plurality of materials having the average particle diameters different from each other included in the organic photoelectric conversion layer include particle diameters calculated from a largest peak in an XRD profile.

(10)

A solid-state imaging apparatus provided with pixels each including one or a plurality of organic photoelectric converters, the organic photoelectric converters each including:
a first electrode;
a second electrode opposed to the first electrode; and
an organic photoelectric conversion layer provided between the first electrode and the second electrode and formed using a plurality of materials having average particle diameters different from each other, the plurality of materials including at least fullerene or a derivative thereof.

(11)

The solid-state imaging apparatus according to (10), in which one or a plurality of the organic photoelectric converters and one or a plurality of inorganic photoelectric converters that performs photoelectric conversion in a wavelength region different from the organic photoelectric converters are stacked in each of the pixels.

(12)

The solid-state imaging apparatus according to any one of (1) to (11), in which
the inorganic photoelectric converter is formed to be embedded in a semiconductor substrate, and
the organic photoelectric converter is formed on a first surface side of the semiconductor substrate.

(13)

The solid-state imaging apparatus according to (12), in which a multilayer wiring layer is formed on a second surface side of the semiconductor substrate.

(14)

The solid-state imaging apparatus according to (12) or (13), in which
the organic photoelectric converter performs photoelectric conversion of green light, and an inorganic photoelectric converter that performs photoelectric conversion of blue light and an inorganic photoelectric converter that performs photoelectric conversion of red light are stacked in the semiconductor substrate.

(15)

The solid-state imaging apparatus according to any one of (10) to (14), in which a plurality of the organic photoelectric converters that performs photoelectric conversion in wavelength regions different from each other is stacked in each of the pixels.

This application claims the benefit of Japanese Priority Patent Application JP2017-221739 filed with the Japan Patent Office on Nov. 17, 2017, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric conversion element, comprising:
a first electrode;
a second electrode opposed to the first electrode; and
an organic photoelectric conversion layer between the first electrode and the second electrode, wherein
the organic photoelectric conversion layer includes a plurality of materials,
a first average particle diameter of a first material of the plurality of materials is different from a second average particle diameter of a second material of the plurality of materials,
the plurality of materials includes at least one of fullerene or a derivative of the fullerene, and
at least the first material includes an organic semiconductor material having crystallinity.

2. The photoelectric conversion element according to claim 1, wherein
the first average particle diameter of the first material corresponds to a smallest average particle diameter of a plurality of average particle diameters associated with the plurality of materials,
the second average particle diameter of the second material corresponds to a largest average particle diameter of the plurality of average particle diameters, and
a particle diameter ratio of the first material with respect to the second material is one of less than or equal to 0.6.

3. The photoelectric conversion element according to claim 2, wherein the organic photoelectric conversion layer further includes:
a hole transportable organic semiconductor material,
an organic semiconductor material having an absorption maximum wavelength in a selective wavelength region, and
the second material includes the hole transportable organic semiconductor material.

4. The photoelectric conversion element according to claim 3, wherein the first material includes the organic semiconductor material having the absorption maximum wavelength in the selective wavelength region.

5. The photoelectric conversion element according to claim 1, wherein an average surface roughness Ra of the organic photoelectric conversion layer is one of less than or equal to 2 nm.

6. The photoelectric conversion element according to claim 1, wherein the organic semiconductor material having the crystallinity is a hole transportable material.

7. The photoelectric conversion element according to claim 1, wherein each of the first average particle diameter and the second average particle diameter is calculated based on an X-ray diffraction (XRD) method.

8. The photoelectric conversion element according to claim 7, wherein each of the first average particle diameter and the second average particle diameter is calculated based on a largest peak in an XRD profile.

9. A solid-state imaging apparatus, comprising:
a plurality of pixels, wherein
each pixel of the plurality of pixels includes a plurality of organic photoelectric converters, and
each organic photoelectric converter of the plurality of organic photoelectric converters includes:
a first electrode;
a second electrode opposed to the first electrode; and
an organic photoelectric conversion layer between the first electrode and the second electrode, wherein
the organic photoelectric conversion layer includes a plurality of materials,
a first average particle diameter of a first material of the plurality of materials is different from a second average particle diameter of a second material of the plurality of materials, and
the plurality of materials includes at least one of fullerene or a derivative of the fullerene.

10. The solid-state imaging apparatus according to claim 9, wherein
each pixel of the plurality of pixels further includes a plurality of inorganic photoelectric converters,
each inorganic photoelectric converter of the plurality of inorganic photoelectric converters is configured to execute a photoelectric conversion process in a first wavelength region, and
the first wavelength region is different from a second wavelength region associated with the plurality of organic photoelectric converters.

11. The solid-state imaging apparatus according to claim 10, further comprising a semiconductor substrate, wherein
the semiconductor substrate has a first surface side and a second surface side,
each of the plurality of inorganic photoelectric converters is embedded in the semiconductor substrate, and
a specific organic photoelectric converter of the plurality of organic photoelectric converters is on the first surface side of the semiconductor substrate.

12. The solid-state imaging apparatus according to claim 11, further comprising a multilayer wiring layer on the second surface side of the semiconductor substrate.

13. The solid-state imaging apparatus according to claim 11, wherein
the specific organic photoelectric converter is configured to execute a first photoelectric conversion process on a green light,
a first inorganic photoelectric converter of the plurality of inorganic photoelectric converters is configured to execute a second photoelectric conversion process on a blue light,
a second inorganic photoelectric converter of the plurality of inorganic photoelectric converters is configured to execute a third photoelectric conversion process on a red light, and
the specific organic photoelectric converter, the first inorganic photoelectric converter, and the second inorganic photoelectric converter are stacked in the semiconductor substrate.

14. The solid-state imaging apparatus according to claim 9, wherein
the plurality of organic photoelectric converters is stacked in each pixel of the plurality of pixels,
a first organic photoelectric converter of the plurality of the organic photoelectric converters is configured to execute a first photoelectric conversion process in a first wavelength region,
a second organic photoelectric converter of the plurality of the organic photoelectric converters is configured to execute a second photoelectric conversion process in a second wavelength region, and
the first wavelength region is different from the second wavelength region.

* * * * *